(12) United States Patent
Yang et al.

(10) Patent No.: US 10,784,426 B2
(45) Date of Patent: Sep. 22, 2020

(54) DEVICE SUBSTRATE

(71) Applicant: Au Optronics Corporation, Hsinchu (TW)

(72) Inventors: Wen-Wei Yang, Changhua County (TW); Cheng-Chieh Chang, Kaohsiung (TW); Cheng-Yeh Tsai, Taipei (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 16/423,042

(22) Filed: May 27, 2019

(65) Prior Publication Data
US 2020/0144469 A1  May 7, 2020

(30) Foreign Application Priority Data

Nov. 5, 2018 (TW) ............................. 107139151 A

(51) Int. Cl.
*H01L 33/62* (2010.01)
*H01L 33/44* (2010.01)
*H01L 33/38* (2010.01)

(52) U.S. Cl.
CPC ............ *H01L 33/62* (2013.01); *H01L 33/382* (2013.01); *H01L 33/44* (2013.01)

(58) Field of Classification Search
CPC ........ H01L 33/62; H01L 33/44; H01L 33/382
See application file for complete search history.

(56) References Cited

U.S. PATENT DOCUMENTS

| | | | |
|---|---|---|---|
| 5,977,565 A | 11/1999 | Ishikawa et al. | |
| 9,741,785 B2* | 8/2017 | Bower | G06F 3/044 |
| 10,381,335 B2* | 8/2019 | Sasaki | H01L 25/075 |

(Continued)

FOREIGN PATENT DOCUMENTS

| | | |
|---|---|---|
| CN | 1176497 | 3/1998 |
| CN | 108011012 | 5/2018 |
| TW | 201611357 | 3/2016 |

(Continued)

OTHER PUBLICATIONS

Office Action of Taiwan Counterpart Application, dated May 9, 2019, pp. 1-4.

*Primary Examiner* — Julia Slutsker
(74) *Attorney, Agent, or Firm* — JCIPRNET

(57) ABSTRACT

A device substrate includes a receiving substrate, a micro light emitting element, a first wire, and a second wire is provided. The micro light emitting element is disposed on the receiving substrate. The micro light emitting element includes a first type semiconductor layer and a second type semiconductor layer. The first type semiconductor layer is disposed on the receiving substrate and has a first wire connecting surface away from the receiving substrate. The second type semiconductor layer is disposed on a part of the first type semiconductor layer and has a second wire connection surface away from the receiving substrate. The first wire is disposed on the first wire connection surface. The second wire is disposed on the second wire connection surface. A projection range of the first wire perpendicularly projected on the micro light emitting element and a projection range of the second wire perpendicularly projected on the micro light emitting element are at least partially overlap.

11 Claims, 23 Drawing Sheets

(56) References Cited

U.S. PATENT DOCUMENTS

2005/0194606 A1* 9/2005 Oohata ............... H01S 5/04256
　　　　　　　　　　　　　　　　　　　　257/99
2016/0064611 A1 3/2016 Choi et al.

FOREIGN PATENT DOCUMENTS

| TW | 201638913 | 11/2016 |
|---|---|---|
| TW | I644420 | 12/2018 |

* cited by examiner

DEVICE SUBSTRATE

CROSS-REFERENCE TO RELATED APPLICATION

This application claims the priority benefit of Taiwan application serial no. 107139151, filed on Nov. 5, 2018. The entirety of the above-mentioned patent application is hereby incorporated by reference herein and made a part of this specification.

BACKGROUND

Technical Field

The invention relates to a device substrate, and particularly relates to a light emitting device substrate.

Description of Related Art

With advantages such as long life time, small volume, high shock resistance, low heat output, and low power consumption, LEDs have been widely used in indicators or light sources of a variety of household electric appliances and instruments. In recent years, LEDs have been developed toward multicolor and high brightness; therefore, its application scope has been expanded to large outdoor display boards, traffic signal lights, and the like. In the future, LEDs may even become the main illumination light source with both power-saving and environment-protecting functions.

Thus, how to further increase light emitting efficiency of LEDs has become an issue to work on.

SUMMARY

An exemplary embodiment of the disclosure provides a device substrate having a desirable light extraction efficiency.

An exemplary embodiment of the disclosure provides a device substrate having a desirable light emitting efficiency.

An exemplary embodiment of the disclosure provides a device substrate having a desirable light field.

An exemplary embodiment of the disclosure provides a device substrate. The device substrate includes a receiving substrate, a micro light emitting element, a first wire, and a second wire. The micro light emitting element is disposed on the receiving substrate. The micro light emitting element includes a first type semiconductor layer and a second type semiconductor layer. The first type semiconductor layer is disposed on the receiving substrate. The first type semiconductor layer has a first wire connecting surface remote from the receiving substrate. The second type semiconductor layer is disposed on a part of the first type semiconductor layer. The second type semiconductor layer has a second wire connecting surface remote from the receiving substrate. The first wire is disposed on the first wire connecting surface. The second wire is disposed on the second wire connecting surface. A projection range of the first wire perpendicularly projected on the micro light emitting element and a projection range of the second wire perpendicularly projected on the micro light emitting element are at least partially overlapped.

Based on the above, the light emitted by the micro light emitting element can be emitted from at least three sides. In other words, the device substrate has better light extraction efficiency and can have better light emitting efficiency. In addition, the micro light emitting element has a first side remote from the corner, and the first wire and the second wire do not cover the first side. Therefore, the symmetry of the light field of the device substrate can be preferred.

In order to make the aforementioned features and advantages of the invention more comprehensible, embodiments accompanying figures are described in detail below. The described embodiments may be modified in various different ways, without departing from the spirit or scope of the invention.

In the accompanying drawings, thicknesses of devices and so on are exaggerated for clarity. Throughout the specification, the same reference numerals in the accompanying drawings denote the same devices. It should be understood that when an element such as a layer, film, region or substrate is referred to as being "on another element," "connected to another element," or "overlapped to another element," it can be directly on or connected to the other element, or intervening elements may also be present. In contrast, when an element is referred to as being "directly on" or "directly connected to" another element, there are no intervening elements present. As used herein, the term "connected" may refer to physically connected and/or electrically connected.

It should be understood that the terms "first," "second," and "third" may be used to describe different elements, components, regions, layers and/or portions in the disclosure, but these elements, components, regions, layers and/or portions should not be limited by these terms. These terms are only used to distinguish an element, component, region, layer and/or portion to another element, component, region, layer and/or portion. For instance, a first element, component, region, layer and/or portion may be referred to as a second element, component, region, layer and/or portion; similarly, a second element, component, region, layer and/or portion may be referred to as a first element, component, region, layer and/or portion without departing from the scope of the inventive concept.

The term used herein is for the purpose of describing particular embodiments and is not particularly limited. The articles "a," "an," and "the" are intended to include the plural forms as well, unless the context clearly indicates otherwise. The articles "or" is intended to "and/or". As used herein, the term "and/or" includes any one and any combination of any two or more of the associated listed items. It is also to be understood that the terms "comprises," "includes," and "has" specify the presence of stated features, regions, steps, operations, elements, components, and/or combinations thereof, but the existence or addition of one or more other features, regions, steps, operations, elements, components, and/or combinations thereof are not excluded.

Further, relative terms such as "lower" or "bottom" and "upper" or "top" may be used herein for ease of description to describe one element's relationship to another element as shown in the figures. It will be understood that relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. Similarly, if the device in the figures is turned over, an element described as being "below" or "lower" relative to another element will then be "above" or "upper" relative to the other element. Thus, the term "below" encompasses both the below and above orientations depending on the spatial orientation of the device.

The term "about," "approximately," "similar," or "substantially" as used herein is inclusive of the stated value and means within an acceptable range of deviation for the particular value as determined by people having ordinary skill in the art, considering the measurement in question and the error associated with measurement of the particular quantity (i.e., the limitations of the measurement system) or the limitations of the manufacturing system. For instance, "about" may mean within one or more standard deviations, or within, for example, ±30%, ±20%, ±10%, or ±5% of the stated value.

Unless otherwise defined, all terms (including technical and scientific terms) used herein have the same meaning as commonly understood by persons of ordinary skill in the art. It will be further understood that terms, such as those defined in commonly used dictionaries, should be interpreted as having a meaning that is consistent with their meaning in the context of the relevant art and the disclosure and will not be interpreted in an idealized or overly formal sense unless expressly so defined herein.

Exemplary embodiments of the invention are described with reference of schematic cross-sectional views of the idealized embodiments. Therefore, a shape variation of the drawings as a result of a manufacturing technique and/or manufacturing tolerance, for example, is expected. Therefore, the embodiments of the invention should not be interpreted as being limited to specific shapes of the regions shown in the drawings but may include a shape deviation caused during manufacture, for example. For example, a flat area shown in the figures or described herein may practically have rough and/or non-linear characteristics. Moreover, an acute angle shown in the drawings can practically be rounded. Therefore, the shapes shown in the figures are substantially schematic, and the shapes therein are not intended to represent accurate shapes, and are not intended to serve as limitations of the claims.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

FIGS. 1A to 1D are partial cross-sectional views of a part of manufacturing process of a device substrate of a first embodiment of the invention. FIGS. 1E to 1G are partial perspective views of a part of manufacturing process of a device substrate of a first embodiment of the invention. FIG. 1H is a partial top view of a device substrate of a first embodiment of the invention. FIG. 1E may be a perspective view of FIG. 1A. FIG. 1F may be a perspective view of FIG. 1B. FIG. 1G may be a perspective view of FIG. 1D. FIG. 1H may be a perspective view of FIG. 1D. To clearly describe the embodiments of the invention, some of the film layers are omitted in FIGS. 1A to 1H. For example, the first electrode 124, the second electrode 125, and/or the patterned insulating layer 130 in FIGS. 1A to 1D are omitted in FIGS. 1G and 1H.

Figure 1A:
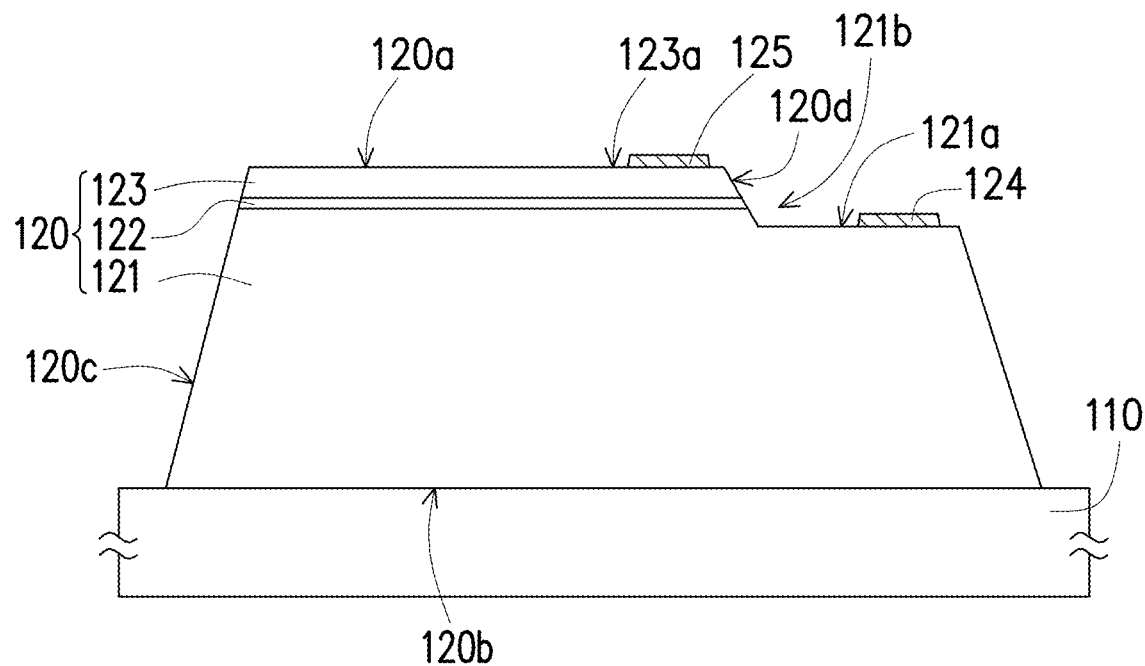
FIGS. 1A to 1D are partial cross-sectional views of a part of manufacturing process of a device substrate of a first embodiment of the invention.
Figure 1B:
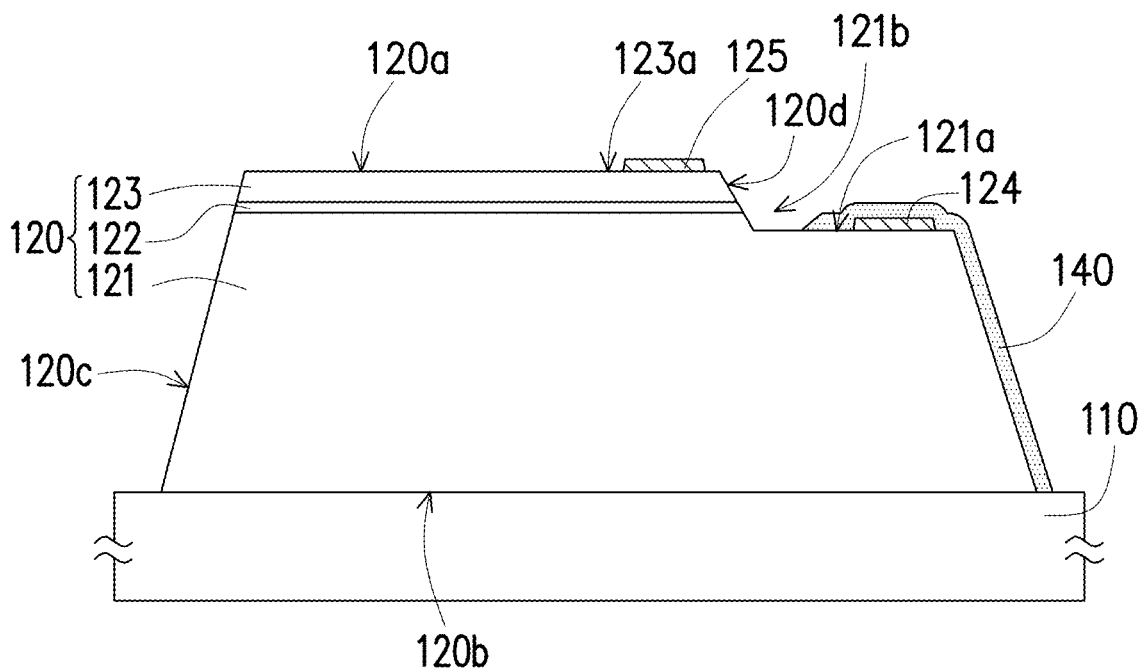
Figure 1C:
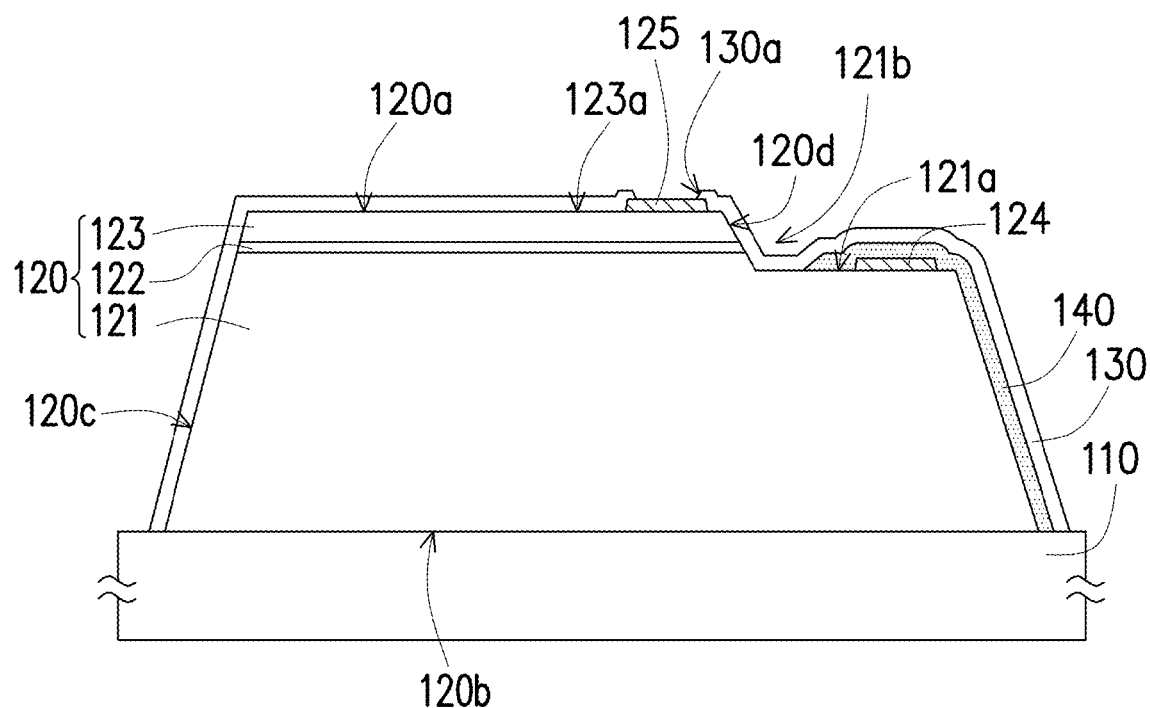
Figure 1D:
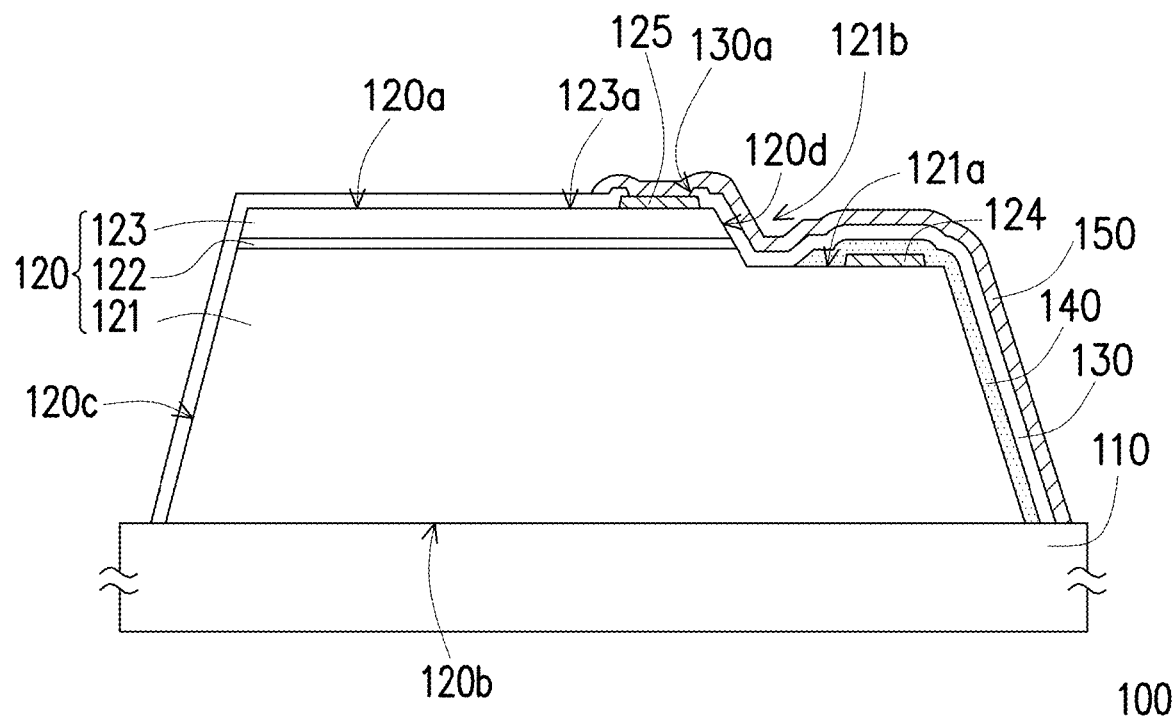
Figure 1E:
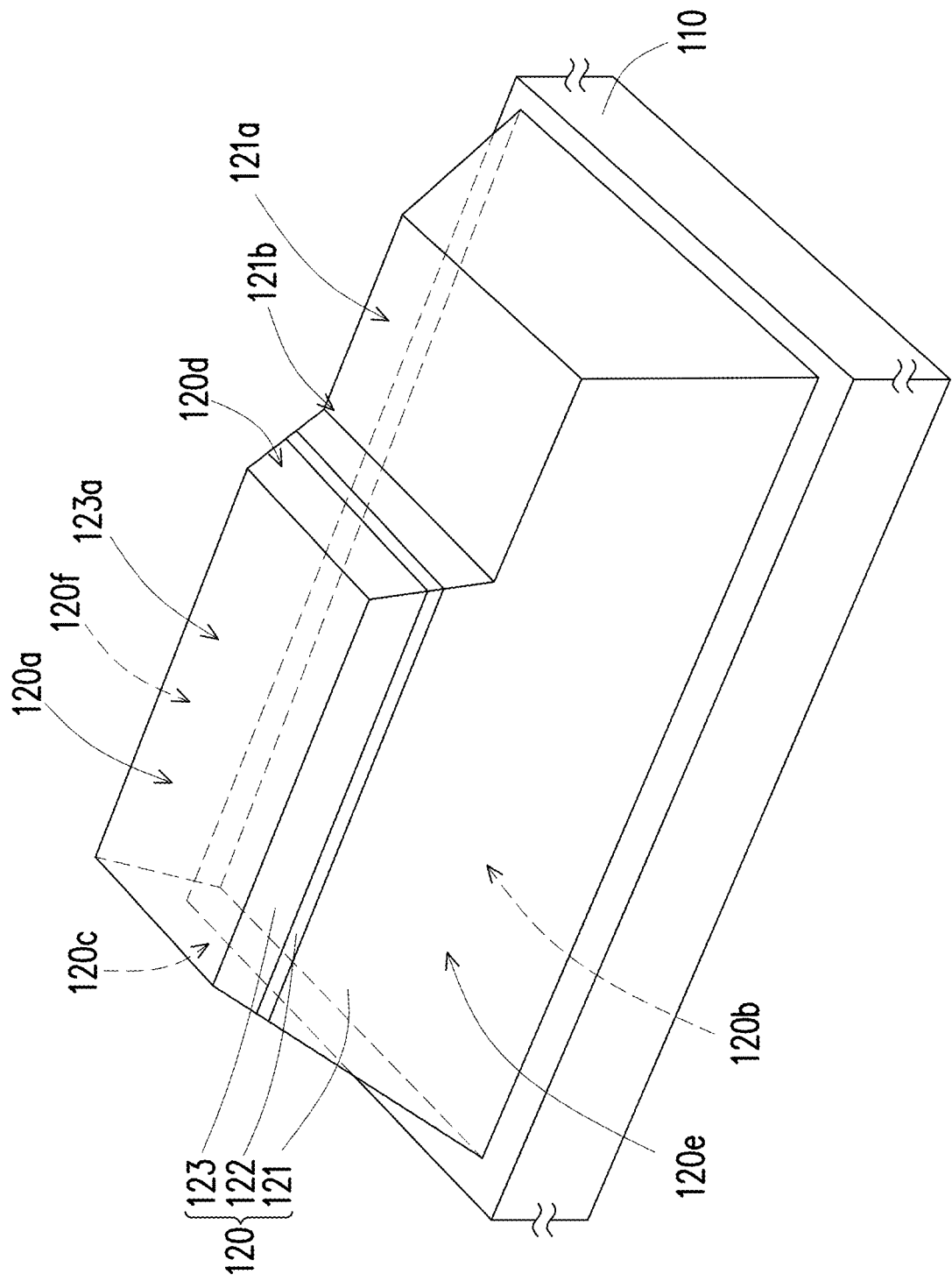
FIGS. 1E to 1G are partial perspective views of a part of manufacturing process of a device substrate of a first embodiment of the invention.
Figure 1F:
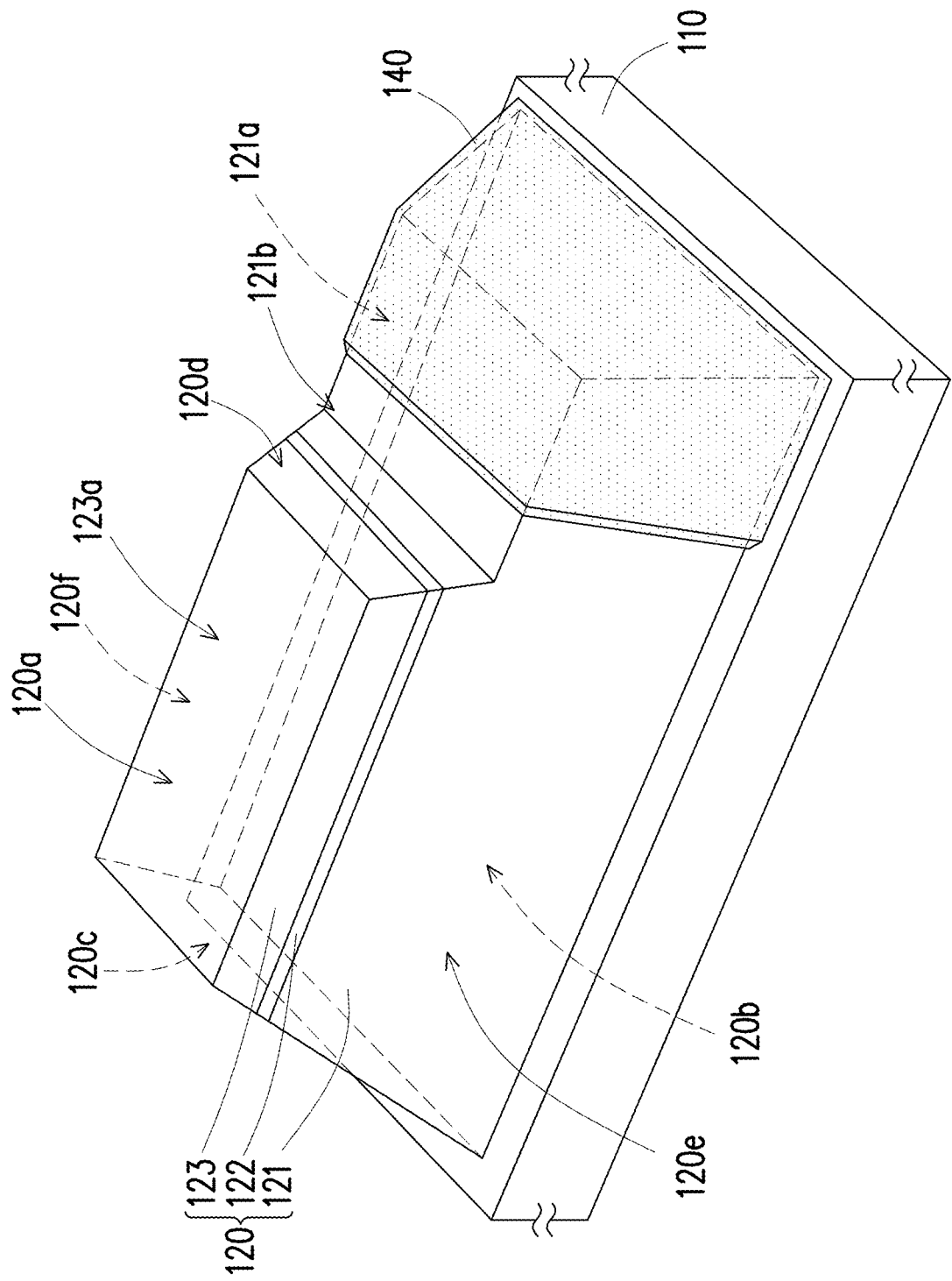
Figure 1G:
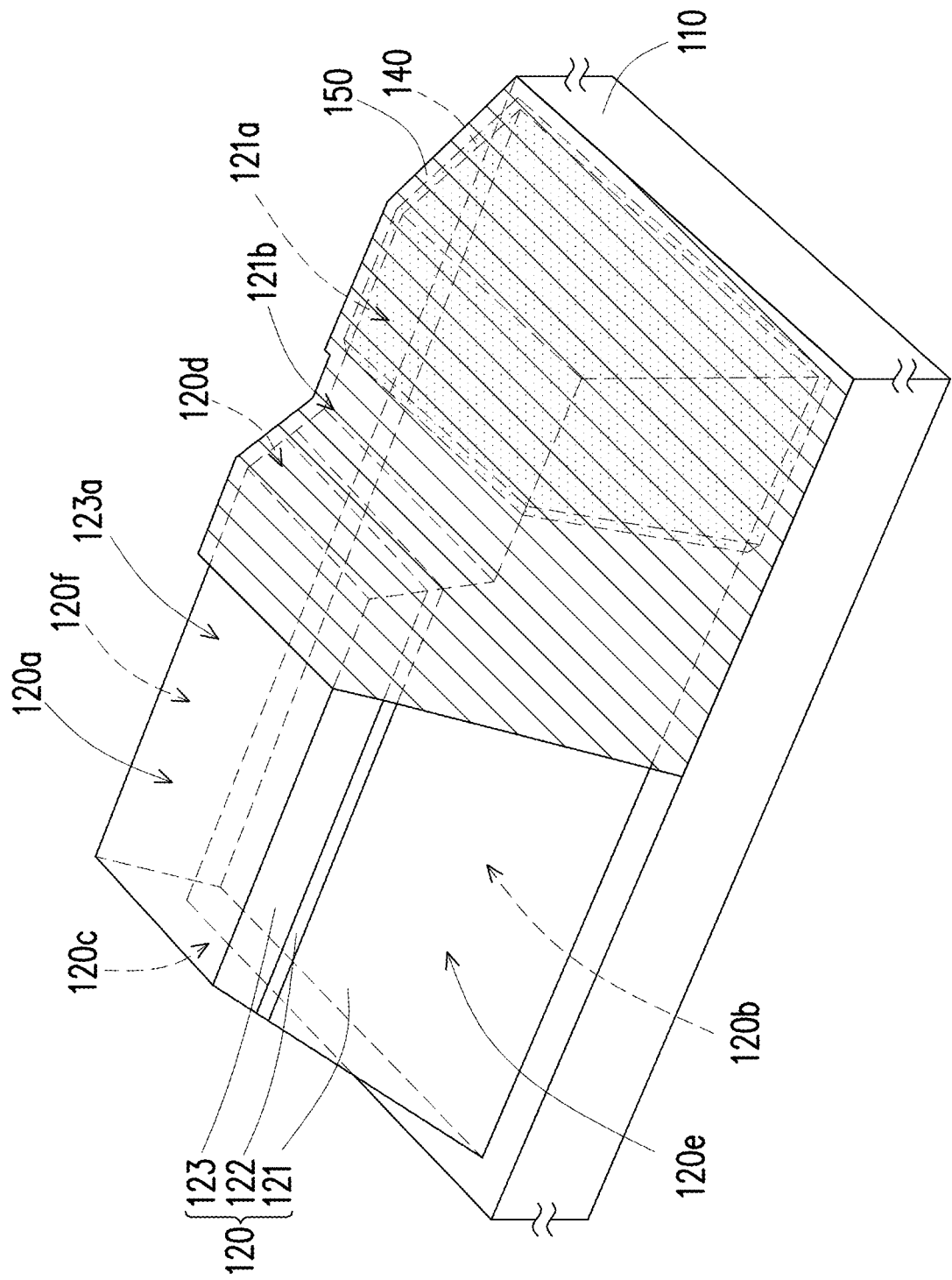
Figure 1H:
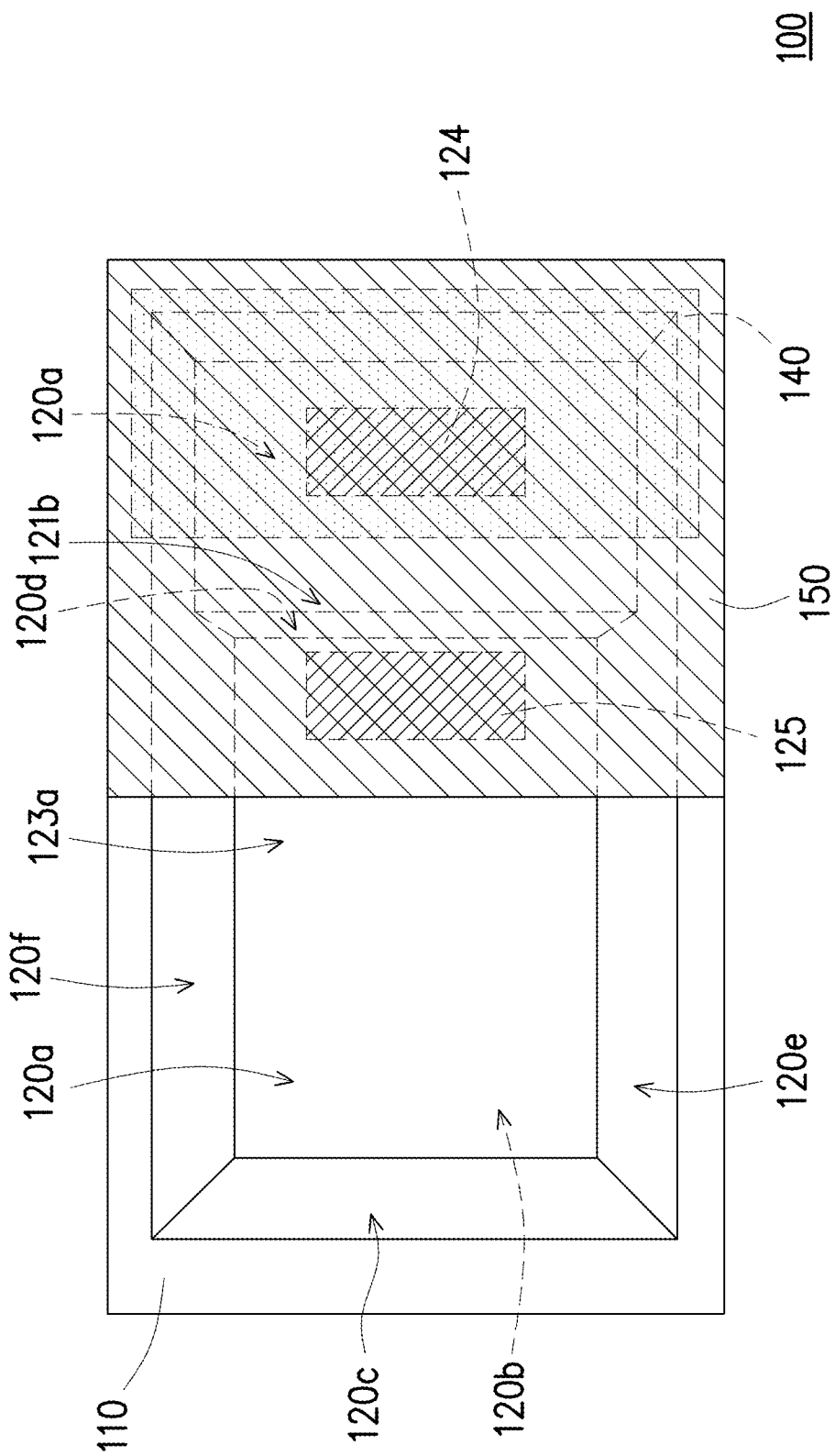
FIG. 1H is a partial top view of a device substrate of a first embodiment of the invention.

Referring to FIGS. 1A and 1E, a receiving substrate 110 is provided. The receiving substrate 110 may include a substrate (not shown in the embodiment, but as, for example, the substrate 111 shown in FIG. 3B or FIG. 4B) and a device layer on the substrate (not shown in the embodiment, but as, for example, the device layer 112 shown in FIG. 3B or FIG. 4B), but the invention is not limited thereto.

Referring to FIGS. 1A and 1E, a micro light emitting element 120 is provided. The micro light emitting element 120 includes a first type semiconductor layer 121, a light emitting region 122, and a second type semiconductor layer 123. The light emitting region 122 is disposed between the first type semiconductor layer 121 and the second type semiconductor layer 123. The first type semiconductor layer 121 has a first wire connecting surface 121a. The second type semiconductor layer 123 has a second wire connecting surface 123a.

In the embodiment, the first type semiconductor layer 121 is an N-type semiconductor layer, and the second type semiconductor layer 123 is a P-type semiconductor layer, but the invention is not limited thereto. In other embodiments, the first type semiconductor layer 121 may be a P-type semiconductor layer, and the second type semiconductor layer 123 may be an N-type semiconductor layer. A material of the N-type semiconductor layer includes n-GaN doped by a Group IVA element (such as Si), for example. A material of the P-type semiconductor layer includes a p-GaN doped by a Group IIA element (such as Mg), for example. But the invention is not limited thereto. The light emitting region 122 includes a multiple quantum well (MQW) structure, for example. The MQW structure includes a plurality of quantum well layers and a plurality of quantum barrier layers that are repetitively and alternately arranged. More specifically, a material of the light emitting region 122 includes a plurality of InGaN layers and a plurality of GaN layers that are alternately stacked, for example. By designing a proportion of In or Ga in the light emitting region 122, the light emitting region 122 may emit light in different wavelength ranges. The first type semiconductor layer 121, the light emitting region 122, and the second type semiconductor layer 123 may be formed by metal-organic chemical vapor deposition (MOCVD), for example. It should be noted that the material and the formation process of the first type semiconductor layer 121, the light emitting region 122, or the second type semiconductor layer 123 described herein are merely examples and shall not be construed as limitations on the invention. For example, the light emitting region 122 may also be a light emitting interface formed by the first type semiconductor layer 121 and the second type semiconductor layer 123.

In the embodiment, the micro light emitting element 120 may further include the first electrode 124, but the invention is not limited thereto. The first electrode 124 is disposed on the first wire connecting surface 121a of the first type semiconductor layer 121. The first electrode 124 is electrically connected to the first type semiconductor layer 121. Considering electrical conductivity, the first electrode 124 substantially includes a metallic material, but the invention is not limited thereto.

In the embodiment, the micro light emitting element 120 may further include the second electrode 125, but the invention is not limited thereto. The second electrode 125 is disposed on the second wire connecting surface 123a of the second type semiconductor layer 123. The second electrode 125 is electrically connected to the second type semiconductor layer 123. Considering electrical conductivity, the second electrode 125 substantially includes a metallic material, but the invention is not limited thereto.

In the embodiment, the first type semiconductor layer 121 has a notch 121b. The notch 121b of the first type semiconductor layer 121 can be formed, for example, by a mesa etching process, but the present invention is not limited thereto.

In the embodiment, the micro light emitting element 120 has a top surface 120a, a bottom surface 120b, a first side surface 120c, a second side surface 120d, a third side surface 120e, and a fourth side surface 120f. The top surface 120a and the bottom surface 120b are opposed to each other. The first side surface 120c and the second side surface 120d are opposed to each other. The third side surface 120e and the fourth side surface 120f are opposed to each other. The third side surface 120e and the fourth side surface 120f are respectively connected to opposite ends of the first side surface 120c and the second side surface 120d. The first side surface 120c, the second side surface 120d, the third side surface 120e, and the fourth side surface 120f are respectively connected to different four sides of the top surface 120a and the bottom surface 120b. The top surface 120a is located substantially on the second type semiconductor layer 123 and/or on the second electrode 125. The bottom surface 120b is located substantially on the first type semiconductor layer 121. In other words, the bottom surface 120b may be a surface in which the first type semiconductor layer 121 is in contact with the receiving substrate 110, which may also be referred to as a lower surface of the first type semiconductor layer 121. The second side surface 120d may be a fold or curved surface that extends from the top surface 120a to the bottom surface 120b. That is, a recess of the second side surface 120d constitutes a notch 121b, and the first side surface 120c is remote from the notch 121b. In other words, the third side surface 120e and the fourth side surface 120f may have a stair-like shape.

In the embodiment, a portion of the top surface 120a may be the second wire connecting surface 123a, and a portion of the second side surface 120d may be the first wire connecting surface 121a, but the invention is not limited thereto.

In the embodiment, the first wire connecting surface 121a of the first type semiconductor layer 121 and the second wire connecting surface 123a of the second type semiconductor layer 123 face substantially the same direction. That is, the micro light emitting element 120 of the embodiment may be a lateral micro light emitting element.

Referring to FIGS. 1A and 1E, the micro light emitting element 120 is disposed on the receiving substrate 110. For example, the micro light emitting element 120 is disposed on the receiving substrate 110 such that the first type semiconductor layer 121 thereof faces the receiving substrate 110.

In some embodiments not shown, there may be other film layers between the micro light emitting element 120 and the receiving substrate 110, but the invention is not limited thereto. For example, the micro light emitting element 120 and the receiving substrate 110 may have an adhesive layer (not shown) therebetween. The micro light emitting element 120 and the receiving substrate 110 may be attached to each other by an adhesive layer (not shown). For another example, the micro-light emitting device 120 and the receiving substrate 110 may have a reflective layer (not shown) therebetween. In a top emission type device substrate, a reflective layer (not shown) may improve the luminance of the light emitted from the device substrate of the embodiment.

Referring to FIGS. 1B and 1F, the first wire 140 is formed at least on the first wire connecting surface 121a. For example, the first wire 140 is formed by, for example, screen printing a silver paste, but the invention is not limited thereto. In other embodiments, the first wire 140 may be formed by a photolithography and etching process after a conductive layer is formed by a physical vapor deposition (PVD) process or the like.

In this embodiment, the first wire 140 may be disposed on the first electrode 124, and the first electrode 124 may be disposed between the first wire 140 and the first wire connecting surface 121a. The first wire 140 does not cover the first side surface 120c. In other words, the first wire 140 is farther remote from the first side surface 120c but closer to the second side surface 120d. The first wire 140 may be electrically connected to the first wire connecting surface 121a of the first type semiconductor layer 121 by the first electrode 124.

In the embodiment, the first wire 140 may cover at least one of a portion of the second side surface 120d, a portion of the third side surface 120e, or a portion of the fourth side surface 120f, and extend onto the receiving substrate 110. In the embodiment of the present invention, the first wire 140 may at least cover a portion of the second side surface 120d and extend onto the receiving substrate 110 as an example, but the invention is not limited thereto.

In some embodiments, the first wire 140 may be electrically connected to the receiving substrate 110, but the invention is not limited thereto.

Referring to FIG. 1C, a patterned insulating layer 130 is formed on the micro light emitting element 120. The patterned insulating layer 130 at least covers a portion of the first wire 140 and a portion of the first type semiconductor layer 121. For example, an insulation material layer is formed, for example, by chemical vapor deposition (PECVD). The insulating material layer comprises, for example, a silicon nitride layer and/or a silicon oxide layer or other suitable insulating material. The insulation material layer may be patterned by performing an etching process, so as to form the patterned insulation layer 130. But the invention is not limited thereto.

In the embodiment, the patterned insulating layer 130 may cover the first side surface 120c, the top surface 120a, and/or the second side surface 120d of the micro light emitting element 120, but the invention is not limited thereto. If the patterned insulating layer 130 covers the second electrode 125, the patterned insulating layer 130 at least has a contact hole corresponding to the second electrode 125 (e.g., the second contact hole 130a), so that the subsequently formed or configured electronic component can be electrically connected to the second electrode 125 by the contact hole (e.g., the second contact hole 130a).

In the embodiment, the patterned insulating layer 130 may be a single layer structure, but the invention is not limited thereto. In other embodiments, the patterned insulating layer 130 can be a multilayer structure. The insulating material of the patterned insulating layer 130 may be a commonly used or suitable insulating material.

In other embodiments not shown, the patterned insulating layer 130 may further cover the third side surface 120e (shown in FIG. 1F) and/or the fourth side surface 120f (shown in FIG. 1F) of the micro light emitting element 120, but the invention is not limited thereto.

Referring to FIG. 1D, FIG. 1G and FIG. 1H, a second wire 150 is formed at least on a portion of the second wire connecting surface 123a and a portion of patterned insulating layer 130. As shown in FIG. 1H, in a projection range in which the micro light emitting element 120 is perpendicularly projected on the receiving substrate 110, a projection range of the first wire 140 perpendicularly projected on the receiving substrate 110 and a projection range of the second wire 150 perpendicularly projected on the receiving substrate 110 are at least partially overlapped. For example, the second wire 150 is formed by, for example, screen printing a silver paste, but the invention is not limited thereto. In other embodiments, the second wire 150 may be formed by a photolithography and etching process after a conductive layer is formed by a physical vapor deposition process or the like. The patterned insulating layer 130 is at least disposed between the first wire 140 and the second wire 150 to separate the first wire 140 and the second wire 150 from each other.

In this embodiment, the second wire 150 may be disposed on the second electrode 125, and the second electrode 125 may be disposed between the second wire 150 and the second wire connecting surface 123a. The second wire 150 does not cover the first side surface 120c. In other words, the second wire 150 is farther remote from the first side surface 120c but closer to the second side surface 120d. The second wire 150 may be electrically connected to the second wire connecting surface 123a of the second type semiconductor layer 123 by the second electrode 125.

In the embodiment, the second wire 150 may cover at least one of a portion of the second side surface 120d, a portion of the third side surface 120e, or a portion of the fourth side surface 120f, and extend onto the receiving substrate 110, but the invention is not limited thereto. In other words, neither the second wire 150 nor the first wire 140 covers the first side surface 120c, and the second wire 150 and the first wire 140 extend in the substantially same direction, but the invention is not limited thereto. In other embodiments, neither the second wire 150 nor the first wire 140 cover the first side surface 120c, and the second wire 150 and the first wire 140 extend in different directions. In the embodiment of the present invention, the second wire 150 may at least cover a portion of the second side surface 120d and extend onto the receiving substrate 110 as an example, but the invention is not limited thereto.

In some embodiments, the second wire 150 may be electrically connected to the receiving substrate 110, but the invention is not limited thereto.

With the processes, manufacturing of the device substrate 100 according to the present embodiment of the invention is substantially completed. The device substrate 100 includes a receiving substrate 110, a micro light emitting element 120, a first wire 140, and a second wire 150. The micro light emitting element 120 is disposed on the receiving substrate 110. The micro light emitting element 120 includes a first type semiconductor layer 121 and a second type semiconductor layer 123. The first type semiconductor layer 121 is disposed on the receiving substrate 110. The first type semiconductor layer 121 has a first wire connecting surface 121a remote from the receiving substrate 110 (e.g., the inner surface of the receiving substrate 110). The second type semiconductor layer 123 is disposed on a part of the first type semiconductor layer 131. The second type semiconductor layer 123 has a second wire connecting surface 123a remote from the receiving substrate 110 (e.g., the inner surface of the receiving substrate 110). The first wire 140 is disposed on the first wire connecting surface 121a. The second wire 150 is disposed on the second wire connecting surface 123a. In a projection range in which the micro light emitting element 120 is perpendicularly projected on the receiving substrate 110, a projection range of the first wire 140 perpendicularly projected on the receiving substrate 110 and a projection range of the second wire 150 perpendicularly projected on the receiving substrate 110 are at least partially overlapped. Therefore, the projection range of the second wire 150 on the micro light emitting element 120 perpendicularly projected on the receiving substrate 110 at least partially overlaps with the projection range of the first wire 140 perpendicularly projected on the receiving substrate 110. In other words, for the second wire 150 and the first wire 140 disposed on the micro light emitting element 120, the extending path of the second wire 150 is longer than the extending path of the first wire 140.

In the embodiment, the micro light emitting element 120 may further include a first electrode 124 and a second electrode 125. The first electrode 124 is disposed between the first wire 140 and the first wire connecting surface 121a. The second electrode 125 is disposed between the second wire 150 and the second wire connecting surface 123a. However, the invention is not limited thereto. In another embodiment, there may be no electrode (e.g., the first electrode 124) between the first wire 140 and the first wire connecting surface, and/or there may be no electrode (e.g., the second electrode 125) between the second wire 150 and the second wire connecting surface 123a. In the subsequent embodiments or comparative examples, the micro light emitting elements have a first electrode and a second electrode, but the invention is not limited thereto.

In the embodiment, the micro light emitting element 120 has a first side surface 120c, a second side surface 120d, a third side surface 120e, and a fourth side surface 120f. The first side 120c is remote from the notch 121b. The second side 120d is opposite the first side 120c. A portion of the second side 120d is the first wire connecting surface 121a. The first wire 140 and the second wire 150 cover at least a portion of the second side 120d. Neither the first wire 140 nor the second wire 150 cover the first side surface 120c. The third side surface 120e and the fourth side surface 120f are connected to the first side surface 120c and the second side surface 120d, respectively.

In the embodiment, the first type semiconductor layer 121 of the micro light emitting element 120 has a notch 121b. The first wire connecting surface 121a may be located in the notch 121b.

In the embodiment, the first wire 140 and the second wire 150 cover a portion of the third side 120e and a portion of the fourth side 120f, but the invention is not limited thereto.

In the embodiment, the device substrate 100 may further include a patterned insulating layer 130. The patterned insulating layer 130 is at least disposed between the first wire 140 and the second wire 150.

In the embodiment, the patterned insulating layer 130 includes a contact hole (e.g., a second contact hole 130a). The second wire 150 is electrically connected to the second type semiconductor layer 123 through a contact hole (e.g., the second contact hole 130a).

In generally, light emitting efficiency of the device substrate 100 is referred to as external quantum efficiency (EQE) defined as a product of multiplication of internal quantum efficiency (IQE) of the device substrate 100 with light extraction efficiency of the device substrate 100. The IQE of the device substrate 100 may be the photoelectric conversion efficiency of the device substrate 100, and is mainly related to inherent properties of the light-emitting element (e.g., the micro light emitting element 120) in the device substrate 100, such as energy band, defect, doped concentration, and/or epitaxial properties of the first semiconductor layer 121, the second semiconductor layer 123, and/or the light emitting region 122. The light extraction efficiency of the device substrate 100 refers to the number of photons measurable outside the light-emitting element (e.g., the micro light emitting element 120) after the photons generated inside the device substrate 100 through photoelectric conversion undergo absorption, refraction, and reflection of the device substrate 100. In other words, the light extraction efficiency of the device substrate 100 is related to properties of the device substrate 100 such as geometric structure and/or light extraction area.

Based on the above, in the device substrate 100 of the embodiment, the projection range in which the micro light emitting element 120 perpendicularly projected on the receiving substrate 110, the projection range in which the first wire 140 perpendicularly projected on the receiving substrate 110, and the projection range in which the second wire 150 perpendicularly projected on the receiving substrate 110 are at least partially overlapped. As such, the light emitted by the micro light emitting element 120 can be emitted from at least three sides (e.g., the first side 120c, at least a portion of the third side 120e, and at least a portion of the fourth side 120f). In other words, the light-emitting area of the micro light emitting element 120 is larger than the overlapping range of the first conductive line 140 and the second conductive line 150 perpendicularly projected on the micro light emitting element 120, that is, the light-emitting direction of the micro light emitting element 120 (e.g., the light intensity is relatively strong or the light exit area is relatively large in this direction) is not located between the first wire 140 and the second wire 150. Therefore, the device substrate 100 can have better light extraction efficiency and can have better light emitting efficiency. In addition, the micro light emitting element 120 has a first side surface 120c remote from the notch 121b, and the first wire 140 and the second wire 150 do not cover the first side surface 120c. Therefore, the symmetry of the light field of the device substrate 100 can be preferred.

Figure 2:
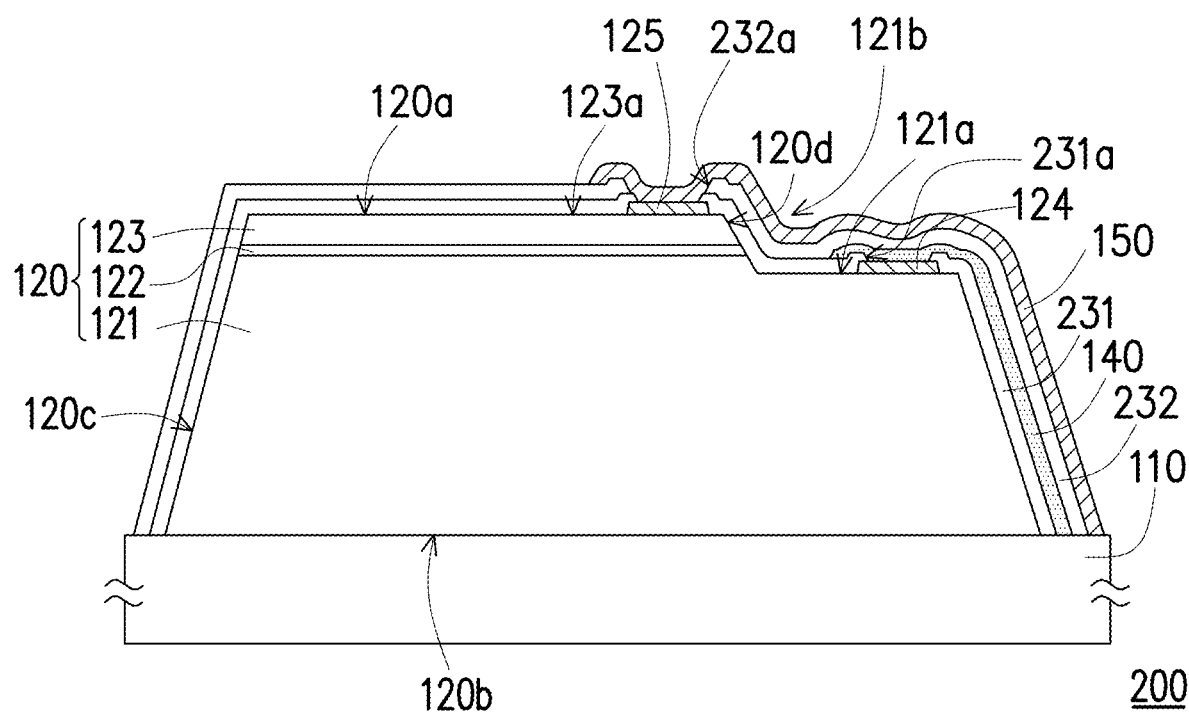
FIG. 2 is a partial cross-sectional view of a device substrate of a second embodiment of the invention.

FIG. 2 is a partial cross-sectional view of a device substrate of a second embodiment of the invention. The device substrate 200 of the present embodiment is similar to the device substrate 100 of the first embodiment, and similar components are marked by identical or similar reference numerals and have similar function, material, or may be formed in a similar manner, and thus relevant descriptions are omitted hereinafter.

In the embodiment, the device substrate 200 includes a first patterned insulating layer 231 and a second patterned insulating layer 232. The first patterned insulating layer 231 includes a first contact hole 231a. The second patterned insulating layer 232 includes a second contact hole 232a. The first wire 140 is electrically connected to the first type semiconductor layer 121 through the first contact hole 231a. The second wire 150 is electrically connected to the second type semiconductor layer 123 through the second contact hole 232a. The second patterned insulating layer 232 is at least disposed between the first wire 140 and the second wire 150.

In the embodiment, the first patterned insulating layer 231 may be formed before the first conductive line 140. The second patterned insulating layer 232 may be formed after the first wire 140 and formed before the second wire 150. The formation or material of the first patterned insulating layer 231 and/or the second patterned insulating layer 232 may be substantially the same or different from the patterned insulating layer 130 described above, and thus relevant descriptions are omitted herein.

Figure 3A:
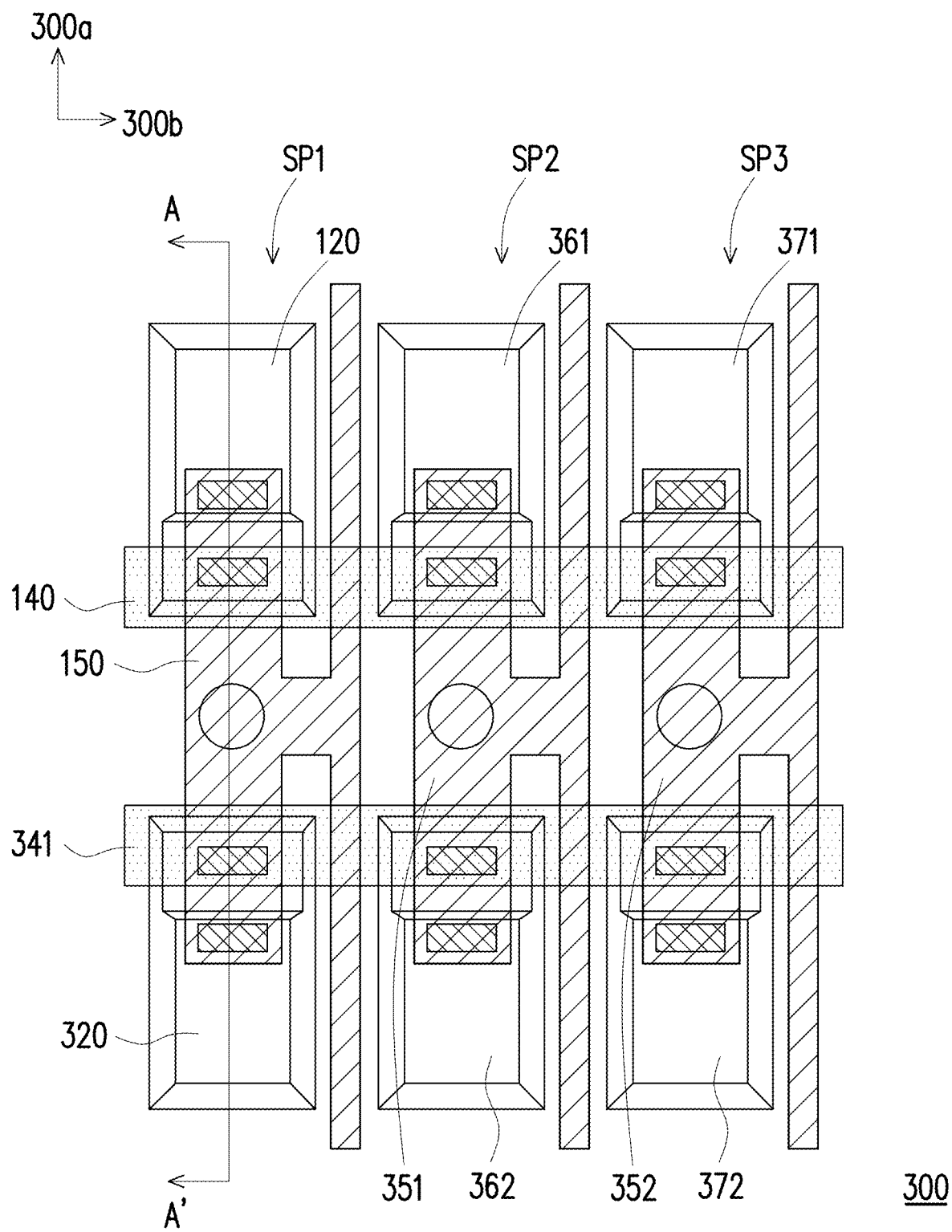
FIG. 3A is a partial top view of a device substrate of a third embodiment of the invention.
Figure 3B:
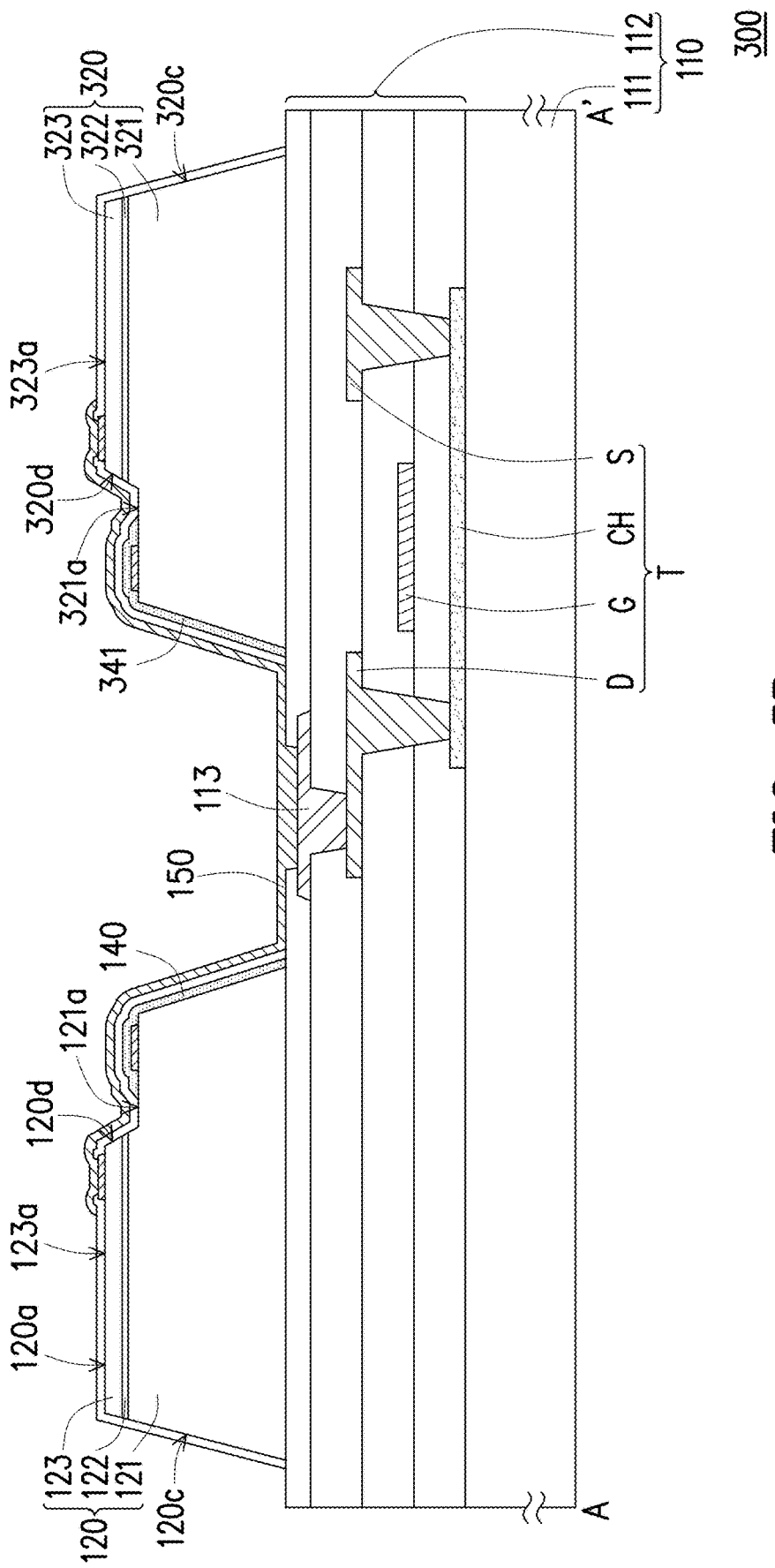
FIG. 3B is a partial cross-sectional view of a device substrate of a third embodiment of the invention.

FIG. 3A is a partial top view of a device substrate of a third embodiment of the invention. FIG. 3B is a partial cross-sectional view of a device substrate of a third embodiment of the invention. FIG. 3B may be a schematic cross-sectional view taken along line AA' of FIG. 3A.

In the embodiment, the receiving substrate 110 may include a substrate 111 and a device layer 112 on the substrate 111.

The material of the substrate 111 may be glass, quartz, organic polymer or other suitable materials, but the invention is not limited thereto.

The device layer 112 may include an active device T, a corresponding wire (e.g., a scan line, a data line, or other suitable signal line), a connection pad for electrically connecting to other electronic components (e.g., the micro light emitting element 120), a passive device (not shown), or other suitable device/element/component, or at least one of the foregoing devices/elements/components. For example, the active device T may include a source S, a drain D, a gate G, and a channel CH. A scan line (not shown) may be electrically connected to the gate G. The data line (not shown) can be electrically connected to the source S. The drain D may be electrically connected to the connection pad 113. The connection pad 113 can be used to receive a corresponding voltage delivered by the active device T. In the embodiment, the active device T is, for example, a transistor.

In the embodiment, the device substrate 300 may include a plurality of micro light emitting elements 120, 320, 361, 362, 371, 372, and the micro light emitting elements 120, 320, 361, 362, 371, 372 may be electrically connected to the corresponding active device T of the receiving substrate 110 via one of the corresponding first wires 140, 341 or the corresponding second wires 150, 351, 352.

For example, the device substrate 300 may include a micro light emitting element 120 (which may be referred to as a first micro light emitting element 120 in this embodiment) and a second micro light emitting element 320. For example, the second micro light emitting element 320 includes another first type semiconductor layer 321, another light emitting region 322, and another second type semiconductor layer 323. The light emitting region 322 is disposed between the first type semiconductor layer 321 and the second type semiconductor layer 323. The first type semiconductor layer 321 has a first wire connecting surface 321a. The second type semiconductor layer 323 has a second wire connecting surface 323a. In the embodiment, the second micro light emitting element 320 is disposed on the receiving substrate 110 such that the first type semiconductor layer 321 thereof faces the receiving substrate 110. In other words, the third wire connecting surface 321a is remote from the receiving substrate 110, and the fourth wire connecting surface 323a is remote from to the receiving substrate 110.

In the embodiment, the emitting color of the first micro emitting element 120 and the emitting color of the second micro emitting element 320 may be the same or similar. That is, the structure, material, shape or formation manner of the second micro light emitting element 320 may be substantially the same or similar to the structure, material, shape or formation of the first micro light emitting element 120, but the invention is not limited thereto. In other embodiments, the emitting color of the first micro light emitting element 120 is different from the emitting color of the second micro light emitting element 320. That is, the structure, material, shape or formation of the second micro light emitting element 320 may be substantially different from the structure, material, shape or formation of the first micro light emitting element 120.

In the embodiment, the second type semiconductor layer 123 of the first micro light emitting element 120 and the second type semiconductor layer 323 of the second micro light emitting element 320 can be electrically connected to the corresponding active component T of the receiving substrate 110 via the same second wire 150. For example, the first micro light emitting element 120 and the second micro light emitting element 320 having substantially the same emitting color may constitute a sub-pixel SP1. Therefore, if one of the first micro light emitting element 120 and the second micro light emitting element 320 is damaged, failed, or has low performance, another one of the first micro light emitting element 120 and the second micro light emitting element 320 can still be substantially emitted the light of the same color. As such, the display quality of the device substrate 300 may be improved.

In the embodiment, the first micro light emitting element 120 and the second micro light emitting element 320 are arranged in a mirror image. For example, the first micro light emitting element 120 and the second micro light emitting element 320 may be substantially arranged along the first direction 300a. The first side surface 120c and the second side surface 120d of the first micro light emitting element 120 are located in the first direction 300a. The first side surface 320c and the second side surface 320d of the second micro light emitting element 320 are located in the first direction 300a. The second side surface 120d of the first micro light emitting element 120 is adjacent to the second side surface 320d of the second micro light emitting element 320. The first side surface 120c of the first micro light emitting element 120 and the first side surface 320c of the second micro light emitting element 320 are distant from each other. In other words, the second side surface 120d of the first micro light emitting element 120 and the second side surface 320d of the second micro light emitting element 320 are located between the first side surface 120c of the first micro light emitting element 120 and the first side surface 320c of the second micro light emitting element 320.

In the embodiment, the device substrate 300 may further include, for example, a third micro light emitting element 361, a fourth micro light emitting element 362, a fifth micro light emitting element 371, and a sixth micro light emitting element 372. The emitting color of the third micro light emitting element 361 and the emitting color of the fourth micro light emitting element 362 may be the same or similar. The third micro light emitting element 361 and the fourth micro light emitting element 362 can be electrically connected to the corresponding active components (not shown) of the receiving substrate 110 via the same second wire 351. In other words, the third micro light emitting element 361 and the fourth micro light emitting element 362 having substantially the same emitting color may constitute another sub-pixel SP2. The emitting color of the fifth micro light emitting element 371 and the emitting color of the sixth micro light emitting element 372 may be the same or similar. The fifth micro light emitting element 371 and the sixth micro light emitting element 372 can be electrically connected to the corresponding active components (not shown) of the receiving substrate 110 via the same second wire 352. In other words, the fifth micro light emitting element 371 and the sixth micro light emitting element 372 having substantially the same emitting color may constitute yet another sub-pixel SP3. The sub-pixel SP1, the sub-pixel SP2, and the sub-pixel SP3 may be arranged in the second direction 300b, and the second direction 300b is different from the first direction 300a.

In the embodiment, the sub-pixel SP1, the sub-pixel SP2, and the sub-pixel SP3 may be electrically connected to each other by the corresponding first wires 140 and 341. In other words, the first wires 140, 341 may be used to transfer a common signal. For example, the first micro light emitting element 120, the third micro light emitting element 361, and the fifth micro light emitting element 371 are electrically connected to each other via the first wire 140. For example, the second micro light emitting element 320, the fourth micro light emitting element 362 and the sixth micro light emitting element 372 are electrically connected to each other via the first wires 341.

In the embodiment, the sub-pixel SP1, the sub-pixel SP2, and the sub-pixel SP3 may have different emitting colors from each other. For example, the emitting color of the sub-pixel SP1 may be red, the emitting color of the sub-pixel SP2 may be green, and the emitting color of the sub-pixel SP3 may be blue, but the invention is not limited thereto.

The extending direction of the first wire 140 extends is different from the extending direction of the second wire 150. In the embodiment, the extending direction of the first wire 140 may be crossover (e.g., substantially skewed) to the extending direction of the second wires 150, but the invention is not limited thereto. For example, the first wire 140 can extend substantially in the first direction 300*a*, and the second wire 150 can extend substantially in the second direction 300*b*.

Figure 4A:
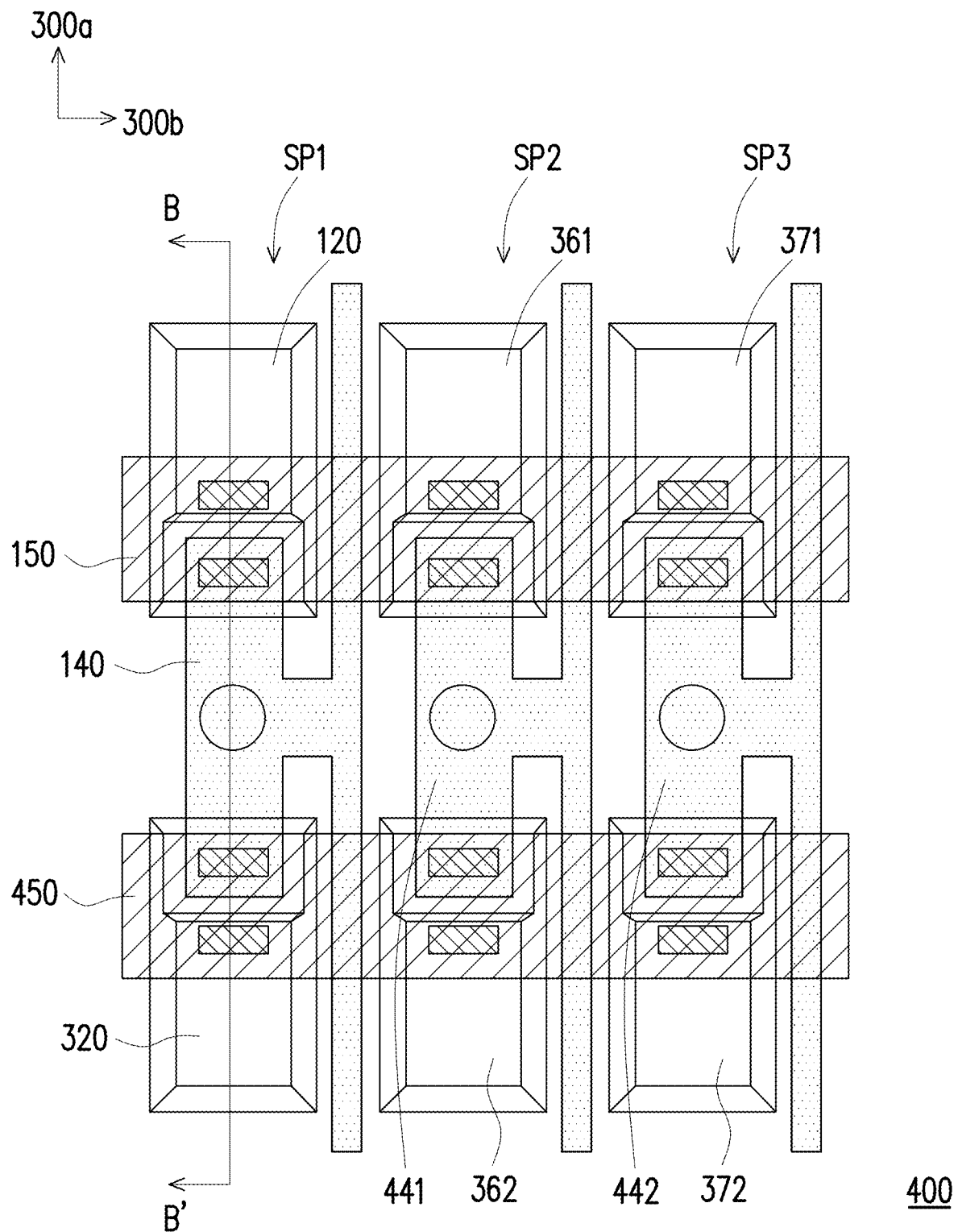
FIG. 4A is a partial top view of a device substrate of a fourth embodiment of the invention.
Figure 4B:
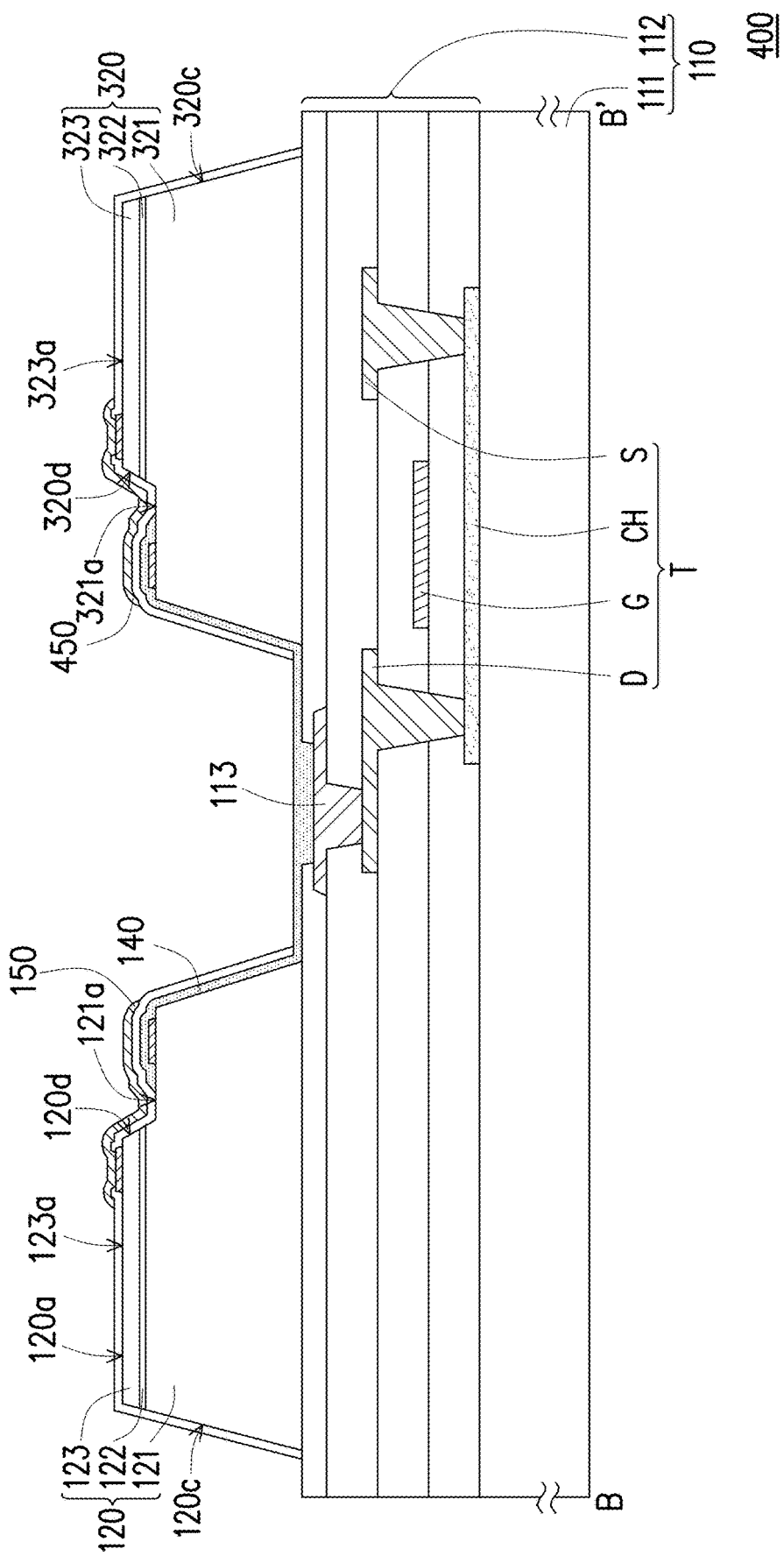
FIG. 4B is a partial cross-sectional view of a device substrate of a fourth embodiment of the invention.

FIG. 4A is a partial top view of a device substrate of a fourth embodiment of the invention. FIG. 4B is a partial cross-sectional view of a device substrate of a fourth embodiment of the invention. FIG. 4B may be a schematic cross-sectional view taken along line BB' of FIG. 4A. The device substrate 400 of the present embodiment is similar to the device substrate 300 of the third embodiment, and similar components are marked by identical or similar reference numerals and have similar function, material, or may be formed in a similar manner, and thus relevant descriptions are omitted hereinafter.

In the embodiment, the first type semiconductor layer 121 of the first micro light emitting element 120 and the first type semiconductor layer 121 of the second micro light emitting element 320 can be electrically connected to the corresponding active component T of the receiving substrate 110 via the same first wire 140. The third micro light emitting element 361 and the fourth micro light emitting element 362 can be electrically connected to the corresponding active components (not shown) of the receiving substrate 110 via the same first wire 441. The fifth micro light emitting element 371 and the sixth micro light emitting element 372 can be electrically connected to the corresponding active components (not shown) of the receiving substrate 110 via the same first wire 442. The sub-pixel SP1, the sub-pixel SP2, and the sub-pixel SP3 may be electrically connected to each other by the corresponding second wires 150 and 450. In other words, the second wires 150, 450 may be used to transfer a common signal. The first wire 140 can extend substantially in the second direction 300*b*, and the second wire 150 and 450 can extend substantially in the second direction 300*a*.

Figure 5A:
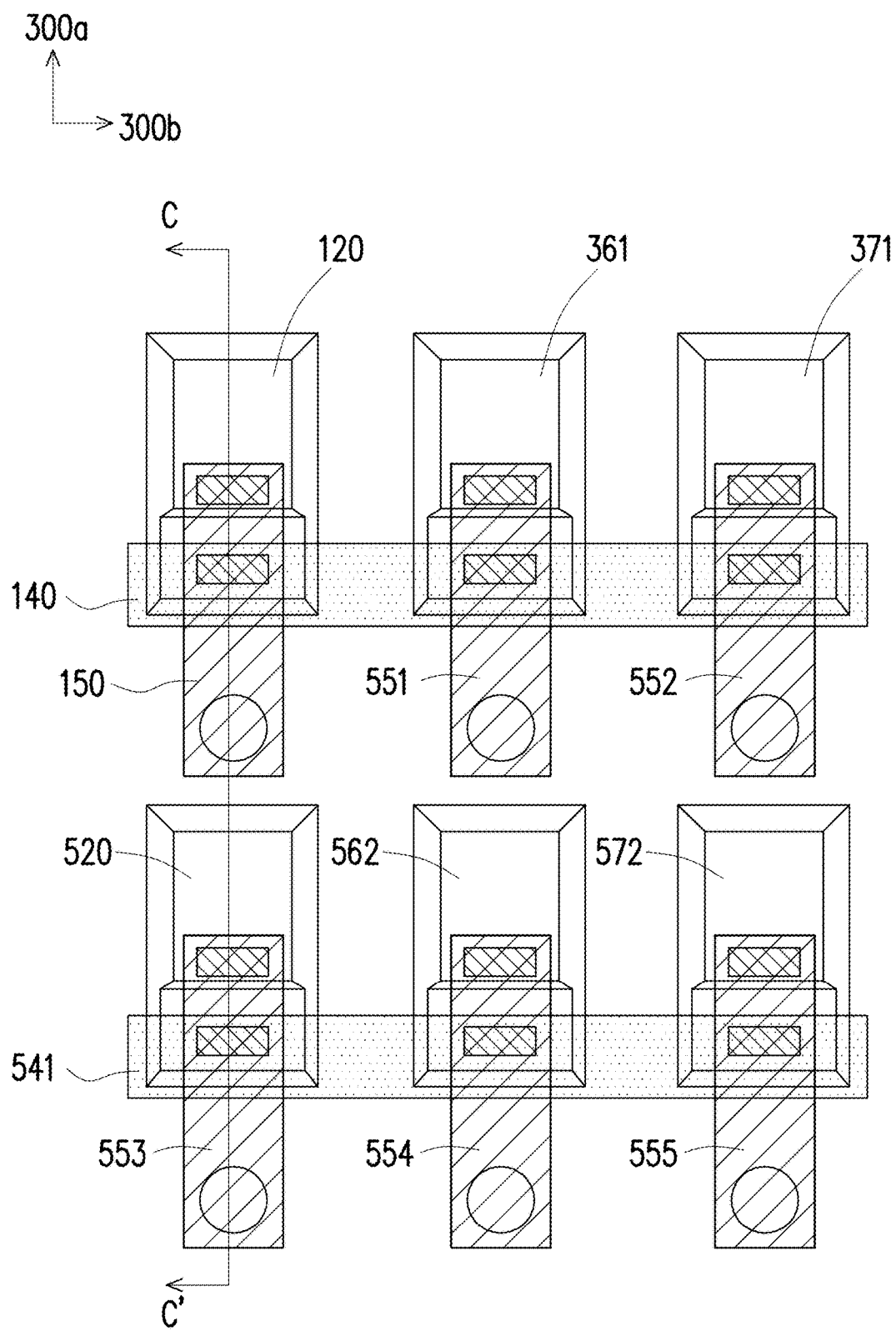
FIG. 5A is a partial top view of a device substrate of a fifth embodiment of the invention.
Figure 5B:
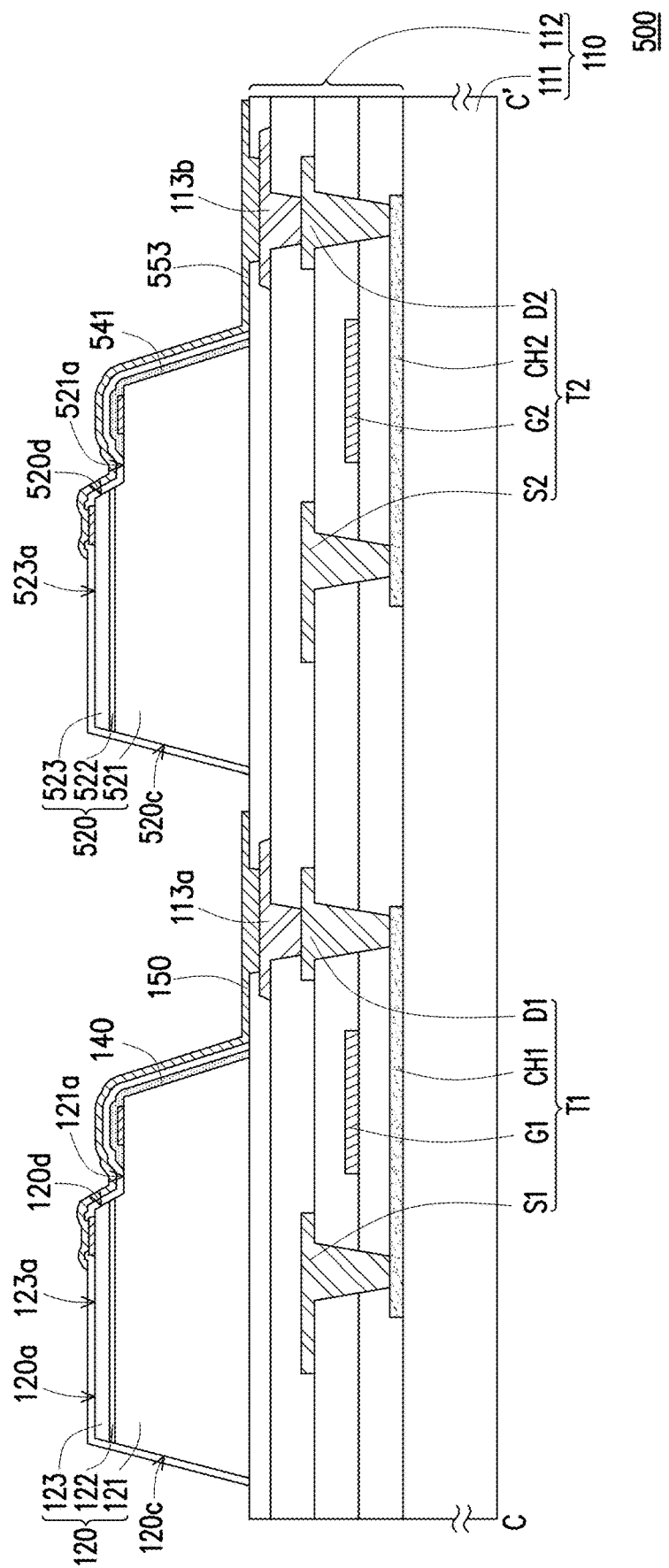
FIG. 5B is a partial cross-sectional view of a device substrate of a fifth embodiment of the invention.

FIG. 5A is a partial top view of a device substrate of a fifth embodiment of the invention. FIG. 5B is a partial cross-sectional view of a device substrate of a fifth embodiment of the invention. FIG. 5B may be a schematic cross-sectional view taken along line CC' of FIG. 5A. The device substrate 500 of the present embodiment is similar to the device substrate 300 of the third embodiment, and similar components are marked by identical or similar reference numerals and have similar function, material, or may be formed in a similar manner, and thus relevant descriptions are omitted hereinafter.

The device layer 112 may include a first active device T1, a second active device T2, a passive device (not shown), a corresponding wire (such as a scan line, a data line, or other similar signal line), or a connection pad for electrically connecting to other electronic components (e.g., the micro light emitting element 120).

The first active device T1 and/or the second active device T2 may be substantially the same or different from the active device T of the previous embodiment (shown in FIG. 3B or FIG. 4B). For example, the first active device T1 may include a source S1, a drain D1, a gate G1, and a channel CH1, and the second active device T2 may include a source S2, a drain D2, a gate G2, and a channel CH2. A scan line (not shown) may be electrically connected to the gate G1, and another scan line (not shown) may be electrically connected to the gate G2. A data line (not shown) may be electrically connected to the source S1, and another data line (not shown) may be electrically connected to the source S2. The drain D1 may be electrically connected to a connection pad 113*a*, and the drain D2 may be electrically connected to the other connection pad 113*b*. The connection pad 113*a* can be used to receive the corresponding voltage delivered by the first active device T1, and the connection pad 113*b* can be used to receive the corresponding voltage delivered by the second active device T2.

In the embodiment, the device substrate 500 may include a plurality of micro light emitting elements 120, 520, 361, 562, 371, 572. The micro light emitting elements 120, 520, 361, 562, 371, 572 may be electrically connected to the corresponding active device of the receiving substrate 110 via one of the corresponding first wires 140, 541 or the corresponding second wires 150, 551, 552, 553, 554, 555.

For example, the device substrate 500 may include a micro light emitting element 120 (which may be referred to as a first micro light emitting element 120 in this embodiment) and a second micro light emitting element 520. For example, the second micro light emitting element 520 includes another first type semiconductor layer 521, another light emitting region 522, and another second type semiconductor layer 523. The light emitting region 522 is disposed between the first type semiconductor layer 521 and the second type semiconductor layer 523. The first type semiconductor layer 521 has a first wire connecting surface 521*a*. The second type semiconductor layer 523 has a second wire connecting surface 523*a*. In the embodiment, the second micro light emitting element 520 is disposed on the receiving substrate 110 such that the first type semiconductor layer 521 thereof faces the receiving substrate 110. In other words, the third wire connecting surface 521*a* is remote from the receiving substrate 110, and the fourth wire connecting surface 523*a* is remote from to the receiving substrate 110.

In the embodiment, the emitting color of the first micro emitting element 120 and the emitting color of the second micro emitting element 520 may be the same or similar. That is, the structure, material, shape or formation manner of the second micro light emitting element 520 may be substantially the same or similar to the structure, material, shape or formation of the first micro light emitting element 120, but the invention is not limited thereto. In other embodiments, the emitting color of the first micro light emitting element 120 may be different from the emitting color of the second micro light emitting element 520.

In the embodiment, the second type semiconductor layer 123 of the first micro light emitting element 120 can be electrically connected to the corresponding first active element T1 of the receiving substrate 110 by a second wire 150, and the second type semiconductor layer 523 of the second micro light emitting element 520 can be electrically connected to the corresponding second active element T2 of the receiving substrate 110 by another second wire 553.

In the embodiment, the second side surface 120*d* of the first micro light emitting element 120 and the other second side surface 520*d* of the second micro light emitting element 520 face to the same direction. For example, the first micro light emitting element 120 and the second micro light emitting element 520 may be substantially arranged along the first direction 300*a*. The first side surface 120*c* and the second side surface 120*d* of the first micro light emitting element 120 are located in the first direction 300*a*. The first side surface 520c and the second side surface 520d of the second micro light emitting element 520 are located in the first direction 300a. The second side surface 120d of the first micro light emitting element 120 is adjacent to the second side surface 520d of the second micro light emitting element 520. The first side surface 120c of the first micro light emitting element 120 and the first side surface 520c of the second micro light emitting element 520 are distant from each other. In other words, the first side surface 520c of the second micro light emitting element 520 is located between the second side surface 120d of the first micro light emitting element 120 and the second side surface 520d of the second micro light emitting element 520.

In the embodiment, the device substrate 500 may further include, for example, a third micro light emitting element 361, a fourth micro light emitting element 562, a fifth micro light emitting element 371, and a sixth micro light emitting element 572. The third micro light emitting element 361 can be electrically connected to the corresponding active component (not shown) of the receiving substrate 110 via the second wire 551. The fourth micro light emitting element 562 can be electrically connected to the corresponding active component (not shown) of the receiving substrate 110 via the second wire 554. The fifth micro light emitting element 371 can be electrically connected to the corresponding active component (not shown) of the receiving substrate 110 via the second wire 552. The sixth micro light emitting element 572 can be electrically connected to the corresponding active component (not shown) of the receiving substrate 110 via the second wire 555.

In the embodiment, the first micro light emitting element 120, the third micro light emitting element 361, and the fifth micro light emitting element 371 can be electrically connected to each other via the first wire 140. The second micro light emitting element 520, the fourth micro light emitting element 562, and the sixth micro light emitting element 572 can be electrically connected to each other via the first wire 541. In other words, the first wires 140, 541 may be used to transfer a common signal.

Figure 6A:
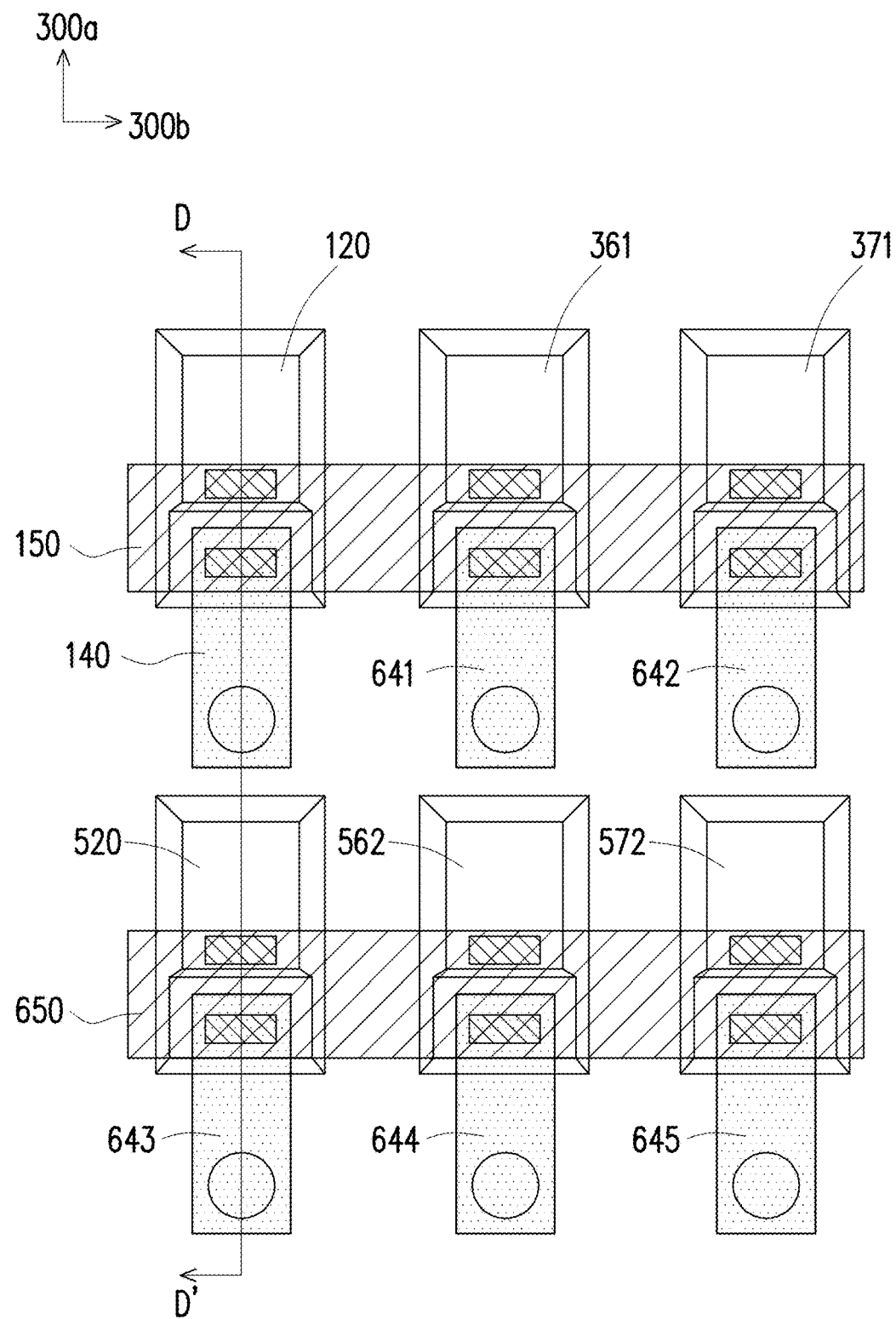
FIG. 6A is a partial top view of a device substrate of a sixth embodiment of the invention.
Figure 6B:
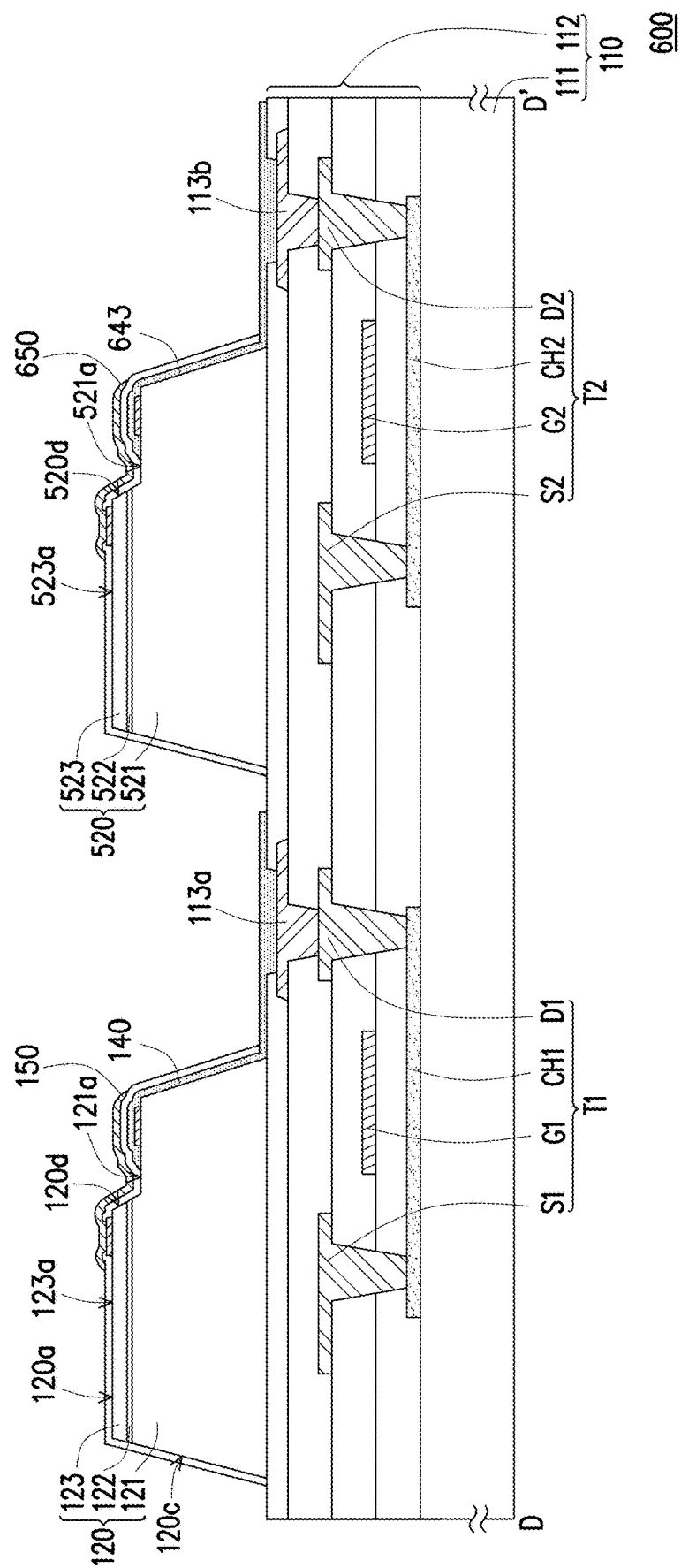
FIG. 6B is a partial cross-sectional view of a device substrate of a sixth embodiment of the invention.

FIG. 6A is a partial top view of a device substrate of a sixth embodiment of the invention. FIG. 6B is a partial cross-sectional view of a device substrate of a sixth embodiment of the invention. FIG. 6B may be a schematic cross-sectional view taken along line DD' of FIG. 6A. The device substrate 600 of the present embodiment is similar to the device substrate 500 of the fifth embodiment, and similar components are marked by identical or similar reference numerals and have similar function, material, or may be formed in a similar manner, and thus relevant descriptions are omitted hereinafter.

In the embodiment, the first type semiconductor layer 121 of the first micro light emitting element 120 can be electrically connected to the corresponding first active element T1 of the receiving substrate 110 via a first wire 140. The first type semiconductor layer 521 of the second micro light emitting element 520 can be electrically connected to the corresponding second active element T2 of the receiving substrate 110 via another first wire 643.

In the embodiment, the device substrate 600 may further include, for example, a third micro light emitting element 361, a fourth micro light emitting element 562, a fifth micro light emitting element 371, and a sixth micro light emitting element 572. The third micro light emitting element 361 can be electrically connected to the corresponding active component (not shown) of the receiving substrate 110 via the first wire 641. The fourth micro light emitting element 562 can be electrically connected to the corresponding active component (not shown) of the receiving substrate 110 via the first wire 644. The fifth micro light emitting element 371 can be electrically connected to the corresponding active component (not shown) of the receiving substrate 110 via the first wire 642. The sixth micro light emitting element 572 can be electrically connected to the corresponding active component (not shown) of the receiving substrate 110 via the first wire 645.

In the embodiment, the first micro light emitting element 120, the third micro light emitting element 361, and the fifth micro light emitting element 371 can be electrically connected to each other via the second wire 150. The second micro light emitting element 520, the fourth micro light emitting element 562, and the sixth micro light emitting element 572 can be electrically connected to each other via the second wire 650. In other words, the second wires 150, 650 may be used to transfer a common signal.

In the following comparative examples and the first embodiment, for example, the illuminance and the light field of different element substrates can be simulated by optical simulation software generally used in the art.

Figure 7A:
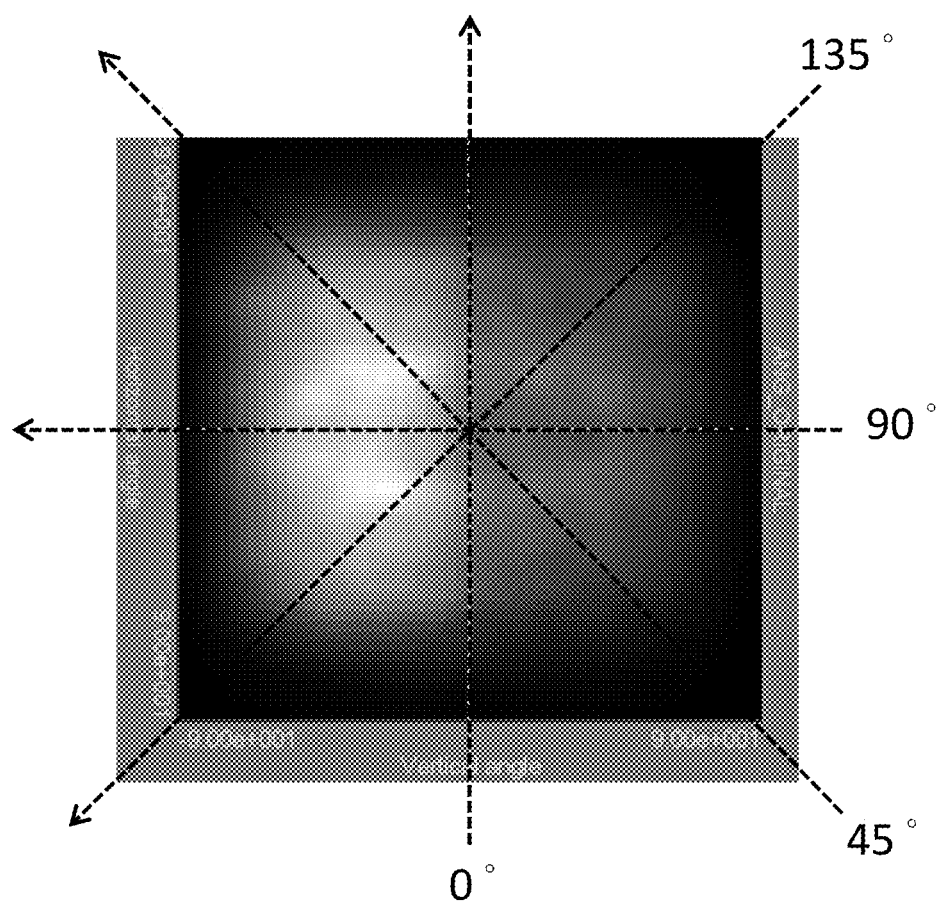
FIG. 7A is a schematic view of a simulation of a light field in a top view state of a partial device substrate of a first comparative example of the invention.
Figure 7B:
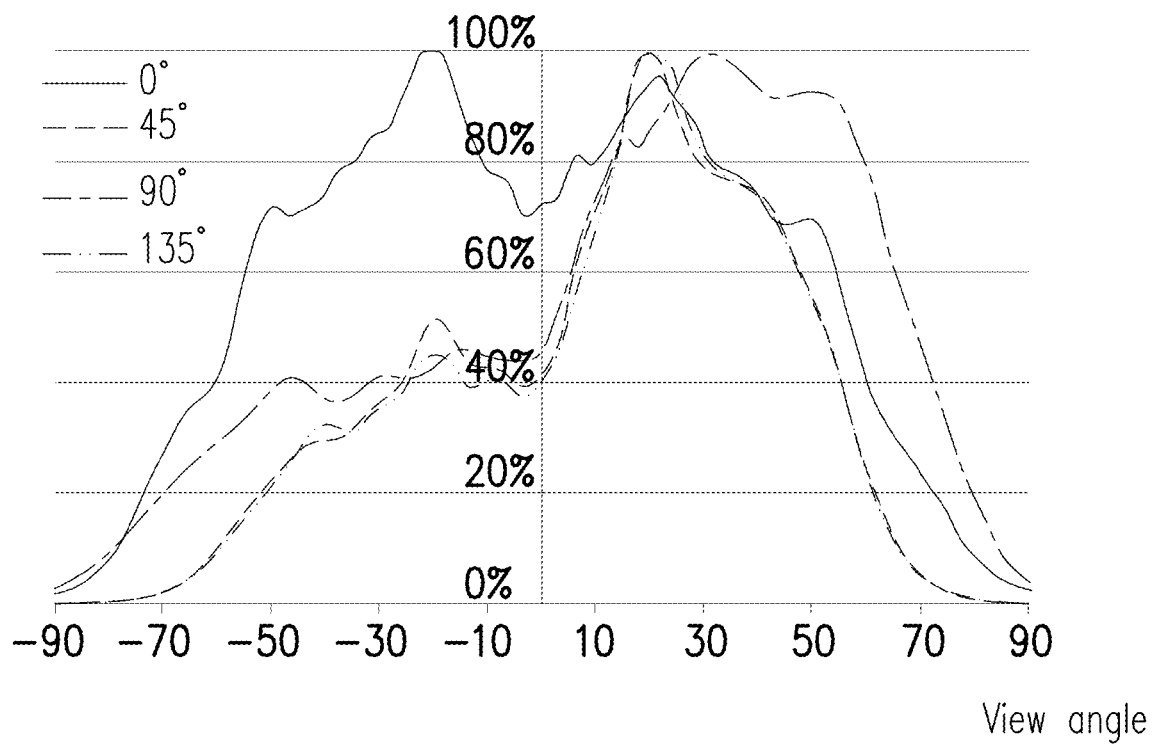
FIG. 7B is a comparison diagram of light field simulations of different angles of view of a partial device substrate of a first comparative example of the invention at different angles in the top view state.
Figure 7C:
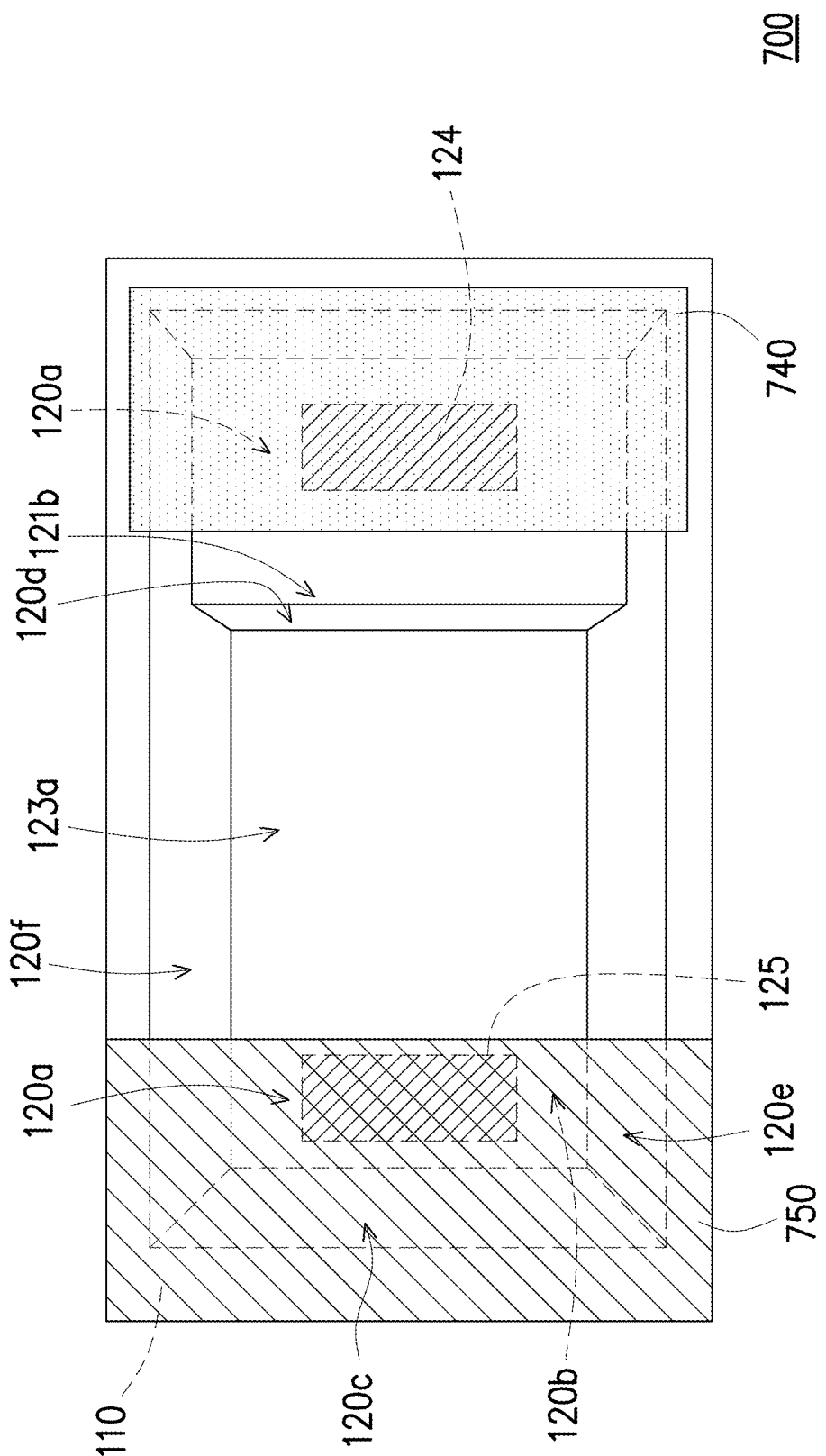
FIG. 7C is a partial top view of a device substrate of a first comparative example of the invention.
Figure 8A:
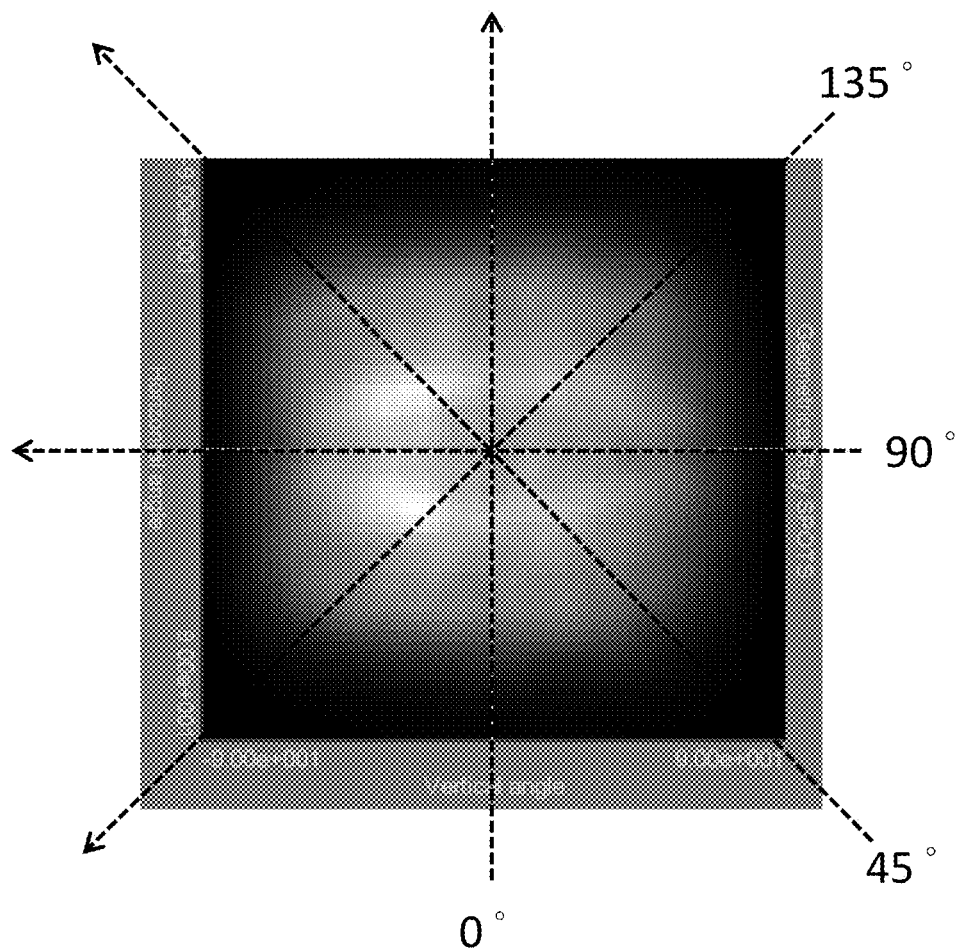
FIG. 8A is a schematic view of a simulation of a light field in a top view state of a partial device substrate of a second comparative example of the invention.
Figure 8B:
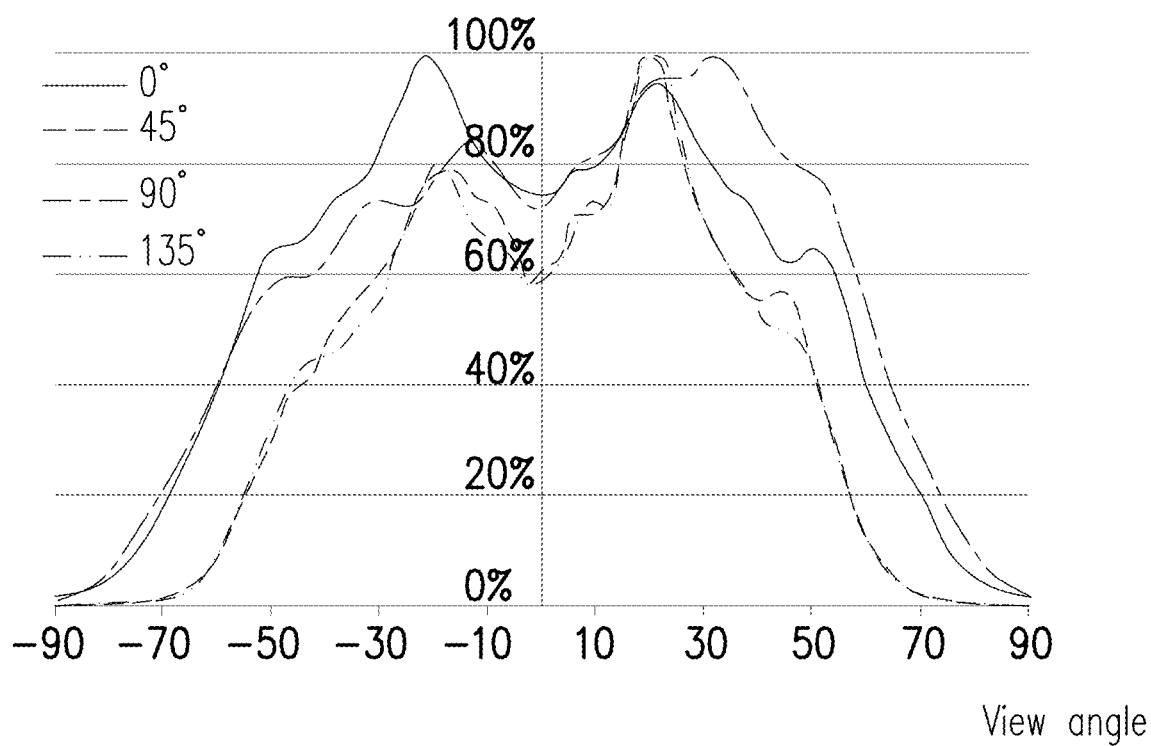
FIG. 8B is a comparison diagram of light field simulations of different angles of view of a partial device substrate of a second comparative example of the invention at different angles in the top view state.
Figure 8C:
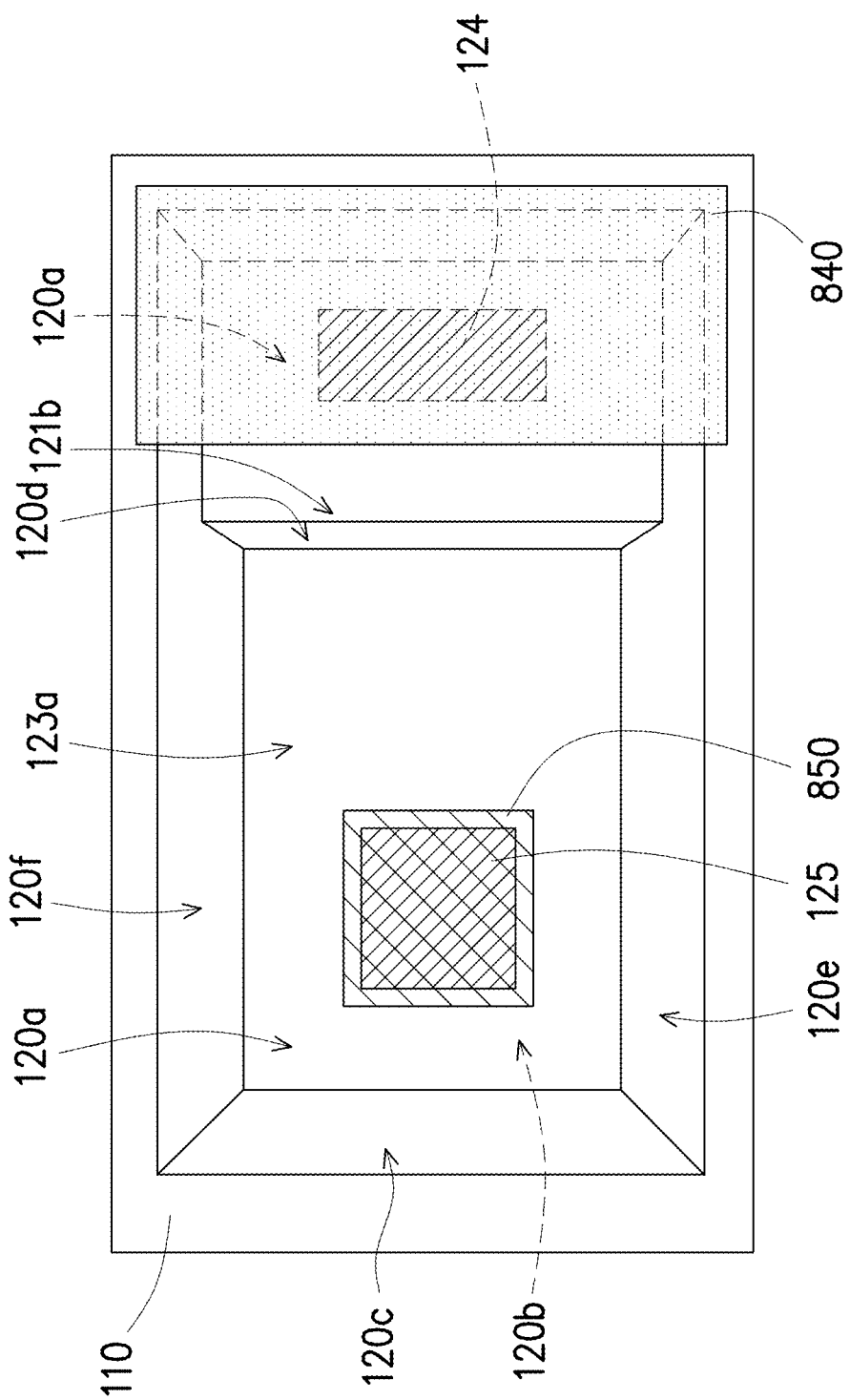
FIG. 8C is a partial top view of a device substrate of a second comparative example of the invention.
Figure 9A:
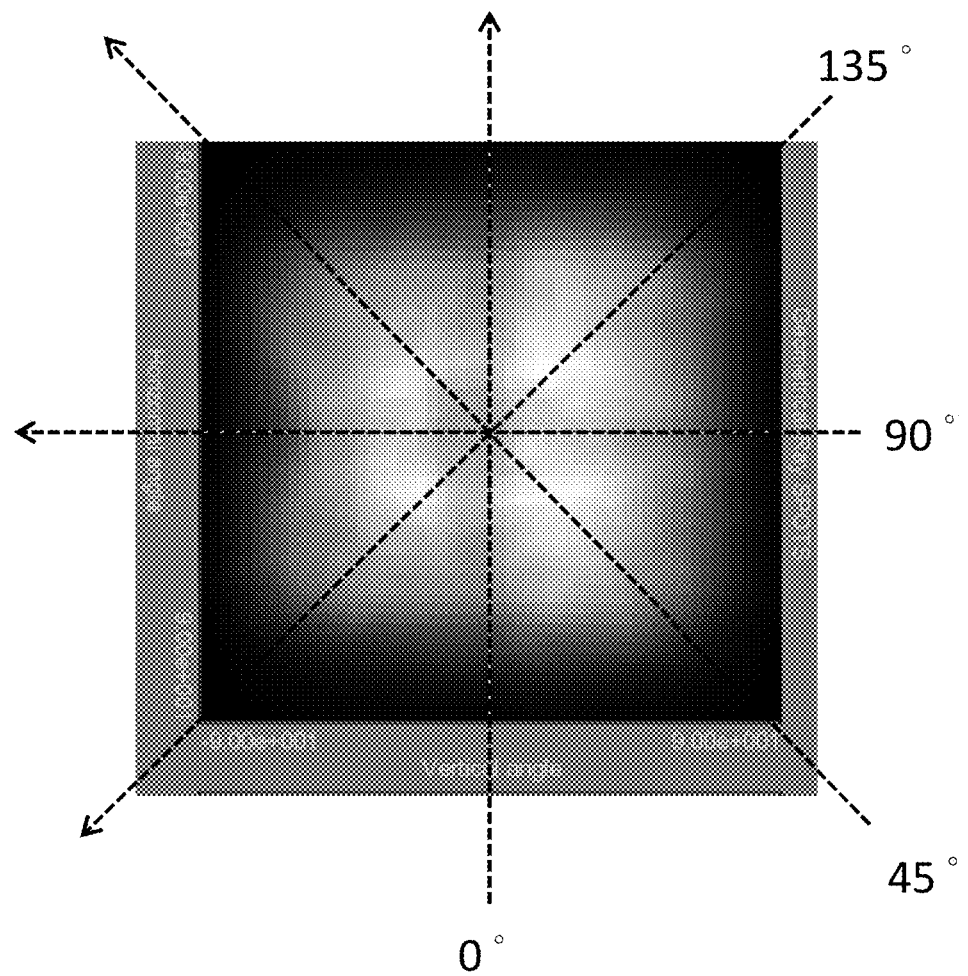
FIG. 9A is a schematic view of a simulation of a light field in a top view state of a partial device substrate of a first embodiment of the invention.
Figure 9B:
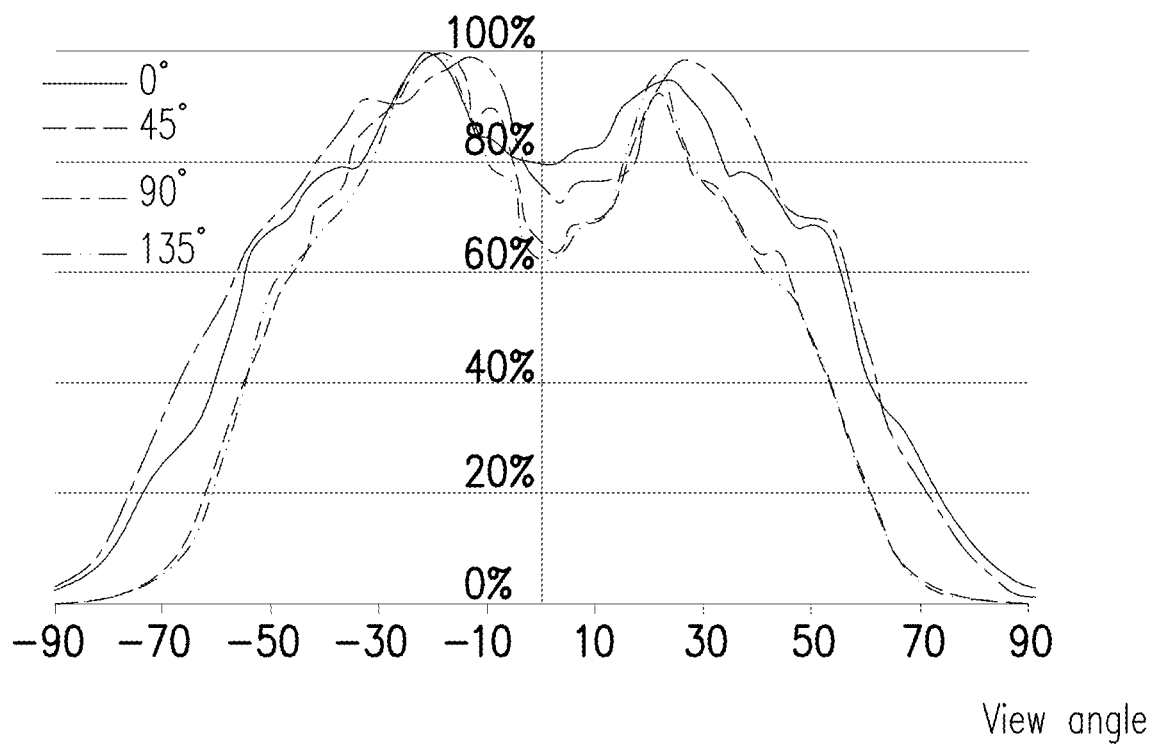
FIG. 9B is a comparison diagram of light field simulations of different angles of view of a partial device substrate of a first embodiment of the invention at different angles in the top view state.

FIG. 7A is a schematic view of a simulation of a light field in a top view state of a partial device substrate of a first comparative example of the invention. FIG. 7B is a comparison diagram of light field simulations of different angles of view of a partial device substrate of a first comparative example of the invention at different angles in the top view state. FIG. 7C is a partial top view of a device substrate of a first comparative example of the invention. FIG. 8A is a schematic view of a simulation of a light field in a top view state of a partial device substrate of a second comparative example of the invention. FIG. 8B is a comparison diagram of light field simulations of different angles of view of a partial device substrate of a second comparative example of the invention at different angles in the top view state. FIG. 8C is a partial top view of a device substrate of a second comparative example of the invention. FIG. 9A is a schematic view of a simulation of a light field in a top view state of a partial device substrate (e.g., device substrate 100 as shown in FIG. 1H) of a first embodiment of the invention. FIG. 9B is a comparison diagram of light field simulations of different angles of view of a partial device substrate of a first embodiment of the invention at different angles in the top view state.

The first comparative example may simulate the light field of one of the micro light emitting elements 120 of the device substrate 700 of the first comparative example in the top view state as shown in FIG. 7C. The second comparative example may simulate the light field of one of the micro light emitting elements 120 of the device substrate 800 of the second comparative example in the upper top state as shown in FIG. 8C. The first experimental example may simulate the light field of one of the micro light emitting elements 120 of the device substrate 100 of the first embodiment in the top view state as shown in FIG. 1H. Further, the area of the upper light emitting area of the micro light emitting element 120 of the device substrate 700 of the first comparative example, the area of the upper light emitting area of the micro light emitting element 120 of the device substrate 800 of the second comparative example, and the area of the upper light emitting area of the micro light emitting element 120 of the element substrate (e.g. the device substrate 100 as shown in FIG. 1H) of the first experimental example are substantially the same.

<Comparison Between the First Comparative Example and the First Experimental Embodiment>

Referring to FIG. 7C, in the device substrate 700 of the first comparative example, in the projection range in which the micro light emitting element 120 is perpendicularly projected on the receiving substrate 110, the projection range in which the first wire 740 is perpendicularly projected on the micro light emitting element 120 does not overlap the projection range in which the second wire 750 is perpendicularly projected on the micro light emitting element 120. In other words, the light-emitting direction of the micro light emitting element 120 (e.g., the light intensity is relatively strong or the light exit area is relatively large in this direction) of the device substrate 700 of the first comparative example is located between the first wire 740 and the second wire 750.

Please refer to FIG. 7A and FIG. 9A. FIG. 7A is a schematic view of a simulated illuminance in a top view state of a partial device substrate 700 of a first comparative example of the invention. FIG. 9A is a schematic view of a simulated illuminance in a top view state of a partial device substrate 100 of a first experimental example of the invention. In FIGS. 7A and 9A, different gray scales represent different illuminances, where white represents the largest illuminance and black represents the minimum illuminance.

As shown in FIGS. 7A and 9A, the light field of FIG. 9A has better symmetry than FIG. 7A.

Specifically, as shown in FIG. 7B and FIG. 9B, FIG. 7B is the light field comparison chart of FIG. 7A at different angles (e.g., about 0°, about 45°, about 90°, and about 135° as depicted in FIG. 7A), and FIG. 9B is the light field comparison chart of FIG. 9A at different angles (e.g., about 0°, about 45°, about 90°, and about 135° as depicted in FIG. 9A). In FIGS. 7B and 9B, the horizontal axis is the view angle and the vertical axis is the relative illuminance.

As shown in FIGS. 7B and 9B, the light field of FIG. 9B has better symmetry than FIG. 7B. That is, the light field of the device substrate of the present invention has better symmetry than the device substrate 700 of the first comparative example.

<Comparison Between the Second Comparative Example and the First Experimental Embodiment>

Referring to FIG. 8C, in the device substrate 800 of the second comparative example, in the projection range in which the micro light emitting element 120 is perpendicularly projected on the receiving substrate 110, the projection range in which the first wire 840 is perpendicularly projected on the micro light emitting element 120 does not overlap the projection range in which the second wire 850 is perpendicularly projected on the micro light emitting element 120. In other words, the light-emitting direction of the micro light emitting element 120 (e.g., the light intensity is relatively strong or the light exit area is relatively large in this direction) of the device substrate 800 of the second comparative example is located between the first wire 840 and the second wire 850. The difference from the device substrate 100 of the first embodiment and the device substrate 800 of FIG. 8C is that the second wire 850 is connected to the opposite substrate through a conductive paste (e.g., an anisotropic conductive film). As such, the second wire 850 in FIG. 8C does not cover the side surface of the micro luminescent element 120.

Please refer to FIG. 8A and FIG. 9A. FIG. 8A is a schematic view of a simulated illuminance in a top view state of a partial device substrate 800 of a second comparative example of the invention. FIG. 9A is a schematic view of a simulated illuminance in a top view state of a partial device substrate 100 of a first experimental example of the invention. In FIGS. 8A and 9A, different gray scales represent different illuminances, where white represents the largest illuminance and black represents the minimum illuminance.

As shown in FIGS. 8A and 9A, the light field of FIG. 9A has better symmetry than FIG. 8A.

Specifically, as shown in FIG. 8B and FIG. 9B, FIG. 8B is the light field comparison chart of FIG. 8A at different angles (e.g., about 0°, about 45°, about 90°, and about 135° as depicted in FIG. 8A), and FIG. 9B is the light field comparison chart of FIG. 9A at different angles (e.g., about 0°, about 45°, about 90°, and about 135° as depicted in FIG. 9A). In FIGS. 8B and 9B, the horizontal axis is the view angle and the vertical axis is the relative illuminance.

As shown in FIGS. 8B and 9B, the light field of FIG. 9B has better symmetry than FIG. 8B. That is, the light field of the device substrate of the present invention has better symmetry than the device substrate 800 of the second comparative example.

The micro light emitting element provided in the foregoing embodiments (e.g., the micro light emitting element 120) are, for instance, smaller than 100 μm, preferably smaller than 50 μm but larger than 0 μm. For instance, the micro light emitting devices may be organic light emitting devices or inorganic light emitting devices, preferably the inorganic light emitting devices, which should however not be construed as a limitation in the disclosure. Structurally, the micro light emitting devices may be P-N diodes, P-I-N diodes, or may have other appropriate structures. The micro light emitting devices may be horizontal type-micro light emitting devices or flipchip type-micro light emitting devices. The micro light emitting devices may be made of an organic material (e.g., an organic polymer luminescent material, an organic small molecule luminescent material, an organic luminescent material, another suitable material, or a combination thereof), an inorganic material (e.g., a perovskite material, a rare earth ion luminescent material, a rare earth fluorescent material, a semiconductor luminescent material, another suitable material, or a combination thereof), another suitable material, or a combination of the foregoing materials.

In the previous embodiments, the active device (e.g., active device T, the first active device T1 or the second active device T2) may be a thin film transistor (TFT), such as a bottom gate transistor, a top gate transistor, a three-dimensional transistor, or another appropriate transistor. A gate electrode (e.g., gates G, G1, G2) of the bottom gate transistor may be located below a channel (e.g., channels CH, CH1, CH2), a gate electrode of the top gate transistor may be located above a channel, and a channel of the three-dimensional transistor is extended and not located on a plane. The channel (e.g., channels CH, CH1, CH2) may be of a single-layer structure or a multi-layer structure, and a material of the semiconductor layer includes amorphous silicon, microcrystalline silicon, nanocrystalline silicon, polysilicon, monocrystalline silicon, an organic semiconductor material, an oxide semiconductor material, a carbon nanotube/nanorod, a perovskite material, another suitable material, or a combination of the foregoing materials.

Besides, the active device (e.g., active component T, first active component T1 or second active component T2), another active component (not shown), and the capacitor (not shown) may be simply referred to as two active devices and one capacitor (as 2T1C). In other embodiments, the number of the active device(s) and the capacitor(s) included in the sub-pixel (e.g., sub-pixels SP1, SP2, SP3) may vary according to actual design, so that the active device(s) and the capacitor (s) may be simply referred to as three active devices and one or two capacitors (as 3T1C/2C), four active devices and one or two capacitors (as 4T1C/2C), five active devices and one or two capacitors (as 5T1C/2C), six active devices and one or two capacitors (as 6T1C/2C), or any other appropriate circuit configuration.

To sum up, in the device substrate provided in one or more exemplary embodiments, the projection range in which the micro light emitting element perpendicularly projected on the receiving substrate, the projection range in which the first wire perpendicularly projected on the receiving substrate, and the projection range in which the second wire perpendicularly projected on the receiving substrate are at least partially overlapped. As such, the light emitted by the micro light emitting element can be emitted from at least three sides. In other words, the device substrate has better light extraction efficiency and can have better light emitting efficiency. In addition, the micro light emitting element has a first side remote from the corner, and the first wire and the second wire do not cover the first side. Therefore, the symmetry of the light field of the device substrate can be preferred.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A device substrate comprising:
   a receiving substrate;
   a first micro light emitting element, disposed on the receiving substrate, and the first micro light emitting element comprising:
      a first type semiconductor layer disposed on the receiving substrate and having a first wire connecting surface remote from the receiving substrate; and
      a second type semiconductor layer disposed on a portion of the first type semiconductor layer and having a second wire connecting surface remote from the receiving substrate;
   a first wire, disposed on the first wire connecting surface; and
   a second wire, disposed on the second wire connecting surface, wherein a projection range of the first wire perpendicularly projected on the first micro light emitting element and a projection range of the second wire perpendicularly projected on the first micro light emitting element are at least partially overlapped, wherein the first type semiconductor layer has a notch, and the first wire connecting surface is located in the notch, and the first micro light emitting element comprising:
      a first side surface remote from the notch;
      a second side surface opposite to the first side surface, and a portion of the second side surface is the first wire connecting surface, wherein the first wire and the second wire cover at least a portion of the second side surface, and the first wire and the second wire do not cover the first side surface; and
      a third side surface and a fourth side surface connected to opposite ends of the first side surface and the second side surface respectively.

2. The device substrate of claim 1, wherein the first micro light emitting element further comprising:
   a first electrode, disposed between the first wire and the first wire connecting surface; and
   a second electrode, disposed between the second wire and the second wire connecting surface.

3. The device substrate of claim 1, further comprising:
   a patterned insulating layer, at least disposed between the first wire and the second wire.

4. The device substrate of claim 3, wherein the patterned insulating layer includes a first contact hole and a second contact hole, the first wire is electrically connected to the first type semiconductor layer through the first contact hole, and the second wire is electrically connected to the second type semiconductor layer through the second contact hole.

5. The device substrate of claim 1, wherein the first wire and the second wire cover a portion of the third side surface and a portion of the fourth side surface.

6. The device substrate of claim 1, further comprising:
   a second micro light emitting element comprising:
      an another first type semiconductor layer disposed on the receiving substrate and having a third wire connecting surface remote from the receiving substrate; and
      an another second type semiconductor layer disposed on a portion of the another first type semiconductor layer and having a fourth wire connecting surface remote from the receiving substrate.

7. The device substrate of claim 6, wherein the another first type semiconductor layer has an another notch, and the second micro light emitting element comprising:
   an another first side surface remote from the another notch; and
   an another second side surface opposite to the another first side surface, and a portion of the another second side surface is the third wire connecting surface.

8. The device substrate of claim 7, further comprising:
   an active device disposed on the receiving substrate, wherein the first micro light emitting element and the second micro light emitting element are arranged along a first direction, the first side surface and the second side surface are located in the first direction, the first micro light emitting element and the second micro light emitting element are arranged in a mirror image, and the first micro light emitting element and the second micro light emitting element are electrically connected to the active device.

9. The device substrate of claim 8, wherein the first wire is connected to the third wire connecting surface, the first wire is electrically connected to the active device, and the second wire is used to transfer a common signal.

10. The device substrate of claim 8, wherein the second wire is connected to the fourth wire connecting surface, the second wire is electrically connected to the active device, and the first wire is used to transfer a common signal.

11. The device substrate of claim 7, further comprising:
    a first active device and a second active device disposed on the receiving substrate, wherein the first micro light emitting element and the second micro light emitting element are arranged along a first direction, the first side surface and the second side surface are located in the first direction, the second side surface of the first micro light emitting element is adjacent to the another first side surface of the second micro light emitting element, the second side surface of the first micro light emitting element is remote from the another second side surface of the second micro light emitting element, the first micro light emitting element is electrically connected to the first active device, and the second micro light emitting element is electrically connected to the second active device.

* * * * *